United States Patent
Cho et al.

(10) Patent No.: US 12,521,819 B2
(45) Date of Patent: Jan. 13, 2026

(54) LASER ANNEALING SYSTEM AND METHOD OF FABRICATING A SEMICONDUCTOR DEVICE USING THE SAME

(71) Applicant: SAMSUNG ELECTRONICS CO., LTD., Suwon-si (KR)

(72) Inventors: Seongkeun Cho, Suwon-si (KR); Hyukjun Kwon, Anyang-si (KR)

(73) Assignees: SAMSUNG ELECTRONICS CO., LTD., Suwon-si (KR); EO Technics Co., Ltd., Anyang-si (KR)

(*) Notice: Subject to any disclaimer, the term of this patent is extended or adjusted under 35 U.S.C. 154(b) by 399 days.

(21) Appl. No.: 16/914,594

(22) Filed: Jun. 29, 2020

(65) Prior Publication Data
US 2021/0138581 A1    May 13, 2021

(30) Foreign Application Priority Data
Nov. 11, 2019   (KR) .................. 10-2019-0143587

(51) Int. Cl.
  *B23K 26/34*   (2014.01)
  *B23K 26/06*   (2014.01)
  (Continued)

(52) U.S. Cl.
  CPC .......... *B23K 26/34* (2013.01); *B23K 26/0648* (2013.01); *B23K 26/073* (2013.01);
  (Continued)

(58) Field of Classification Search
  CPC .. B23K 26/073; B23K 26/0648; B23K 26/34; G02B 3/0037; H01L 21/268; H01L 21/324; H01L 21/67098; H01S 3/0007
  See application file for complete search history.

(56) References Cited

U.S. PATENT DOCUMENTS 6,393,042 B1 *  5/2002  Tanaka ............... G02B 27/0905
                                                         438/30
7,009,140 B2 *  3/2006  Partio ................ B23K 26/0732
                                                         219/121.65
(Continued)

FOREIGN PATENT DOCUMENTS

JP       2004356282 A  * 12/2004
JP          3917231        5/2007
(Continued)

OTHER PUBLICATIONS

Suss MicroOptics, 2008 (Year: 2008).*
(Continued)

*Primary Examiner* — Steven W Crabb
*Assistant Examiner* — Fahmida Ferdousi
(74) *Attorney, Agent, or Firm* — Morgan, Lewis & Bockius LLP

(57) ABSTRACT

Disclosed are a laser annealing system and a method of fabricating a semiconductor device using the same. The laser annealing system having multiple laser devices may include a stage, on which a substrate is loaded, a light source generating a plurality of laser beams to be provided to the substrate, an optical delivery system disposed between the light source and the stage and used to deliver the laser beams, a homogenizing system disposed between the optical delivery system and the stage, the homogenizing system including an array lens including a plurality of lens cells which allow the laser beams to pass therethrough and homogenize the laser beams, and an imaging optical system disposed between the homogenizing system and the stage to image the laser beams on the substrate.

14 Claims, 41 Drawing Sheets

(51) Int. Cl.
  *B23K 26/073* (2006.01)
  *B23K 101/40* (2006.01)
  *G02B 3/00* (2006.01)
  *G02B 27/18* (2006.01)
  *H01L 21/268* (2006.01)
  *H01L 21/324* (2006.01)
  *H01L 21/67* (2006.01)
  *H01S 3/00* (2006.01)

(52) U.S. Cl.
  CPC ........... *G02B 3/0037* (2013.01); *G02B 27/18* (2013.01); *H01L 21/268* (2013.01); *H01L 21/324* (2013.01); *H01L 21/67098* (2013.01); *H01S 3/0007* (2013.01); *B23K 2101/40* (2018.08)

(56) References Cited

U.S. PATENT DOCUMENTS

| | | | |
|---|---|---|---|
| 7,109,435 B2 * | 9/2006 | Tsukihara | B23K 26/0608 219/121.76 |
| 9,025,635 B2 * | 5/2015 | Goutain | H01S 5/02469 372/50.23 |
| 9,908,200 B2 | 3/2018 | Adams et al. | |
| 2001/0015854 A1 | 8/2001 | Yamazaki et al. | |
| 2017/0087664 A1 * | 3/2017 | Cho | B23K 26/354 |
| 2018/0308725 A1 | 10/2018 | Shin et al. | |
| 2018/0350622 A1 | 12/2018 | Ikenoue et al. | |
| 2018/0375285 A1 * | 12/2018 | Seidel | H01S 5/4025 |
| 2019/0015929 A1 | 1/2019 | Cui et al. | |

FOREIGN PATENT DOCUMENTS

| | | | |
|---|---|---|---|
| JP | 2015-012204 | | 1/2015 |
| JP | 5999334 | | 9/2016 |
| KR | 20040017248 A | * | 2/2004 |
| KR | 10-2017-0014554 | | 2/2017 |
| KR | 20170014554 A | * | 2/2017 |
| KR | 10-2018-0131667 | | 12/2018 |

OTHER PUBLICATIONS

2067_SMO_catalog (Year: 2007).*
Spherical mirrors, 2018 (Year: 2018).*
Science.howstuffworks.com, 2018 (Year: 2018).*
KR-20170014554-A (Year: 2017).*
Machine translation of JP-2004356282-A (Year: 2004).*
https://www.newport.com/c/optical-mirrors, https://www.newport.com/c/optical-mirror-mounts, (Year: 2019).*
https://www.rp-photonics.com/output_couplers.html , (Year: 2016).*
https://www.rp-photonics.com/mirror_substrates.html (Year: 2019).*
Machine English translation of KR-20040017248-A (Year: 2004).*
Reinhard Voelkel,et al., "Laser Beam Homogenizing Limitations and Constraints", Proc. SPIE 7102, Optical Fabrication, Testing, and Metrology III, 71020J (Sep. 25, 2008), 5 pages.
Technical Information Sheet 10—Beam Homogenizer, "Strategies for Beam Homogenizing", SUSS MicroOptics SA, Issued Date: 01-06; pp. 1-5.

* cited by examiner

LASER ANNEALING SYSTEM AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2019-0143587, filed on Nov. 11, 2019, in the Korean Intellectual Property Office, the contents of which are herein incorporated by reference in their entirety.

TECHNICAL FIELD

The present inventive concept relates to a system, which is used to fabricate a semiconductor device, and a method of fabricating the semiconductor device using the system, and more particularly, to a laser annealing system and a method of fabricating a semiconductor device using the same.

DISCUSSION OF RELATED ART

In general, a semiconductor device is formed through a plurality of unit processes including a thin-film deposition process, a photolithography process, an etching process, an ion implantation process, and an annealing process. The annealing process may be performed to melt and re-crystalize a substrate or a thin film on the substrate, or to remove seam defects in the thin film. For example, the annealing process may include a rapid thermal treatment process and a laser annealing process. The laser annealing process provides higher efficiency than the rapid thermal treatment process due to high absorption of the laser energy in the thin film or in the substrate. However, to increase the yield of the annealing process, the laser beams having an enhanced uniformity and a reduced shot-to-shot energy variation may be desirable.

SUMMARY

An example embodiment of the present inventive concept provides a laser annealing system, which can be used to enhance the percentile distribution and homogeneity of a laser beam.

According to an example embodiment of the present inventive concept, a laser annealing system may include a stage receiving a substrate, a light source generating a plurality of laser beams and providing the laser beams to the substrate, an optical delivery system disposed between the light source and the stage, the optical delivery system used to deliver the laser beams, a homogenizing system disposed between the optical delivery system and the stage, the homogenizing system including an array lens having a plurality of lens cells which allow the laser beams to pass therethrough and homogenize the laser beams, and an imaging optical system disposed between the homogenizing system and the stage to image the laser beams on the substrate. The optical delivery system may adjust a diameter of each of the laser beams to a value that is about 10 times a width of each of the lens cells or greater.

According to an example embodiment of the present inventive concept, a laser annealing system may include a stage receiving a substrate, a light source generating a plurality of laser beams and providing the laser beams onto the substrate, the light source including first to third lower laser devices, first to third intermediate laser devices disposed on the first to third lower laser devices, and first to third upper laser devices disposed on the first to third intermediate laser devices, a homogenizing system disposed between the light source and the stage, the homogenizing system including array lenses having a plurality of lens cells which allow the laser beams to pass therethrough and homogenize the laser beams, an optical delivery system disposed between the homogenizing system and the light source to deliver the laser beams and to adjust a diameter of each of the laser beams to a value that is about 10 to 12 times a width of each of the lens cells of the array lenses, and an imaging optical system disposed between the homogenizing system and the stage to image the laser beams on the substrate.

According to an example embodiment of the present inventive concept, a method of fabricating a semiconductor device may include forming a polysilicon layer on a substrate and performing a thermal treatment process on the polysilicon layer using a laser annealing system. The laser annealing system may include a stage configured to load the substrate, a light source generating a plurality of laser beams to be provided to the substrate, an optical delivery system disposed between the light source and the stage, the optical delivery system used to deliver the laser beams, a homogenizing system disposed between the optical delivery system and the stage, the homogenizing system including an array lens including a plurality of lens cells which allow the laser beams to pass therethrough and homogenize the laser beams, and an imaging optical system disposed between the homogenizing system and the stage to image the laser beams on the substrate. The optical delivery system may adjust a diameter of each of the laser beams to a value that is about 10 times a width of each of the lens cells or greater.

BRIEF DESCRIPTION OF THE DRAWINGS

The present inventive concept will be more clearly understood from the following description of the example embodiments, taken in conjunction with the accompanying drawings, in which:

FIGS. 11A to 13A, 14 to 18, and 19A to 30A are cross-sectional views, which are taken in a first direction crossing an active region of a semiconductor device;

FIGS. 11B to 13B and 19B to 30B are cross-sectional views, which are taken in a second direction parallel to an extension direction of the active region of the semiconductor device.

Figure 1:
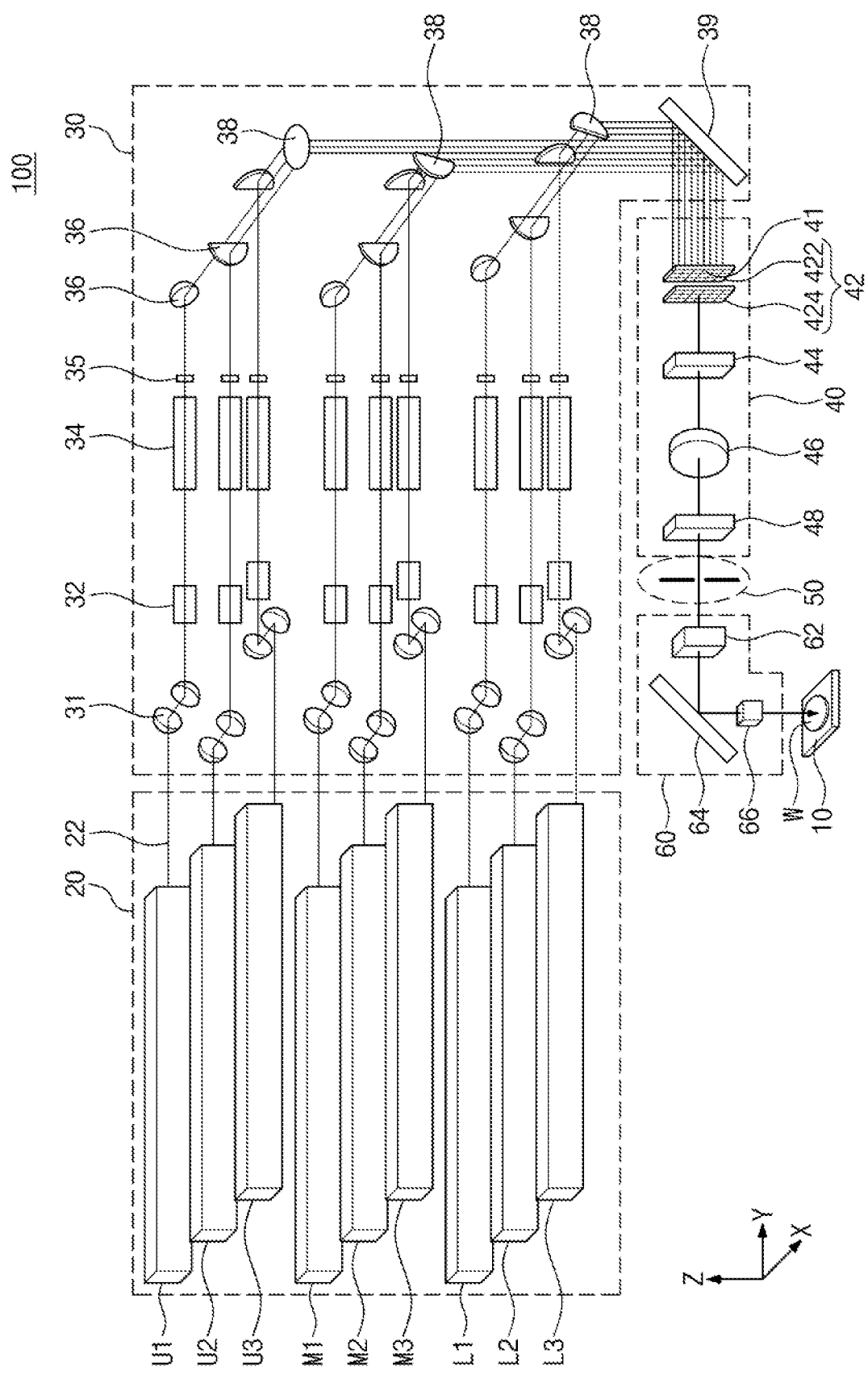
FIG. 1 is a diagram illustrating an example of a laser annealing system according to an example embodiment of the present inventive concept.

Since the drawings in FIGS. 1-31 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 is a diagram illustrating an example of a laser annealing system 100 according to an example embodiment of the present inventive concept.

Referring to FIG. 1, the laser annealing system 100 may include a stage 10, a light source 20, an optical delivery system 30, a homogenizing system 40, a mask 50, and an imaging optical system 60.

The stage 10 may be used to load a substrate W, and may be configured to move the substrate W in two different directions (e.g., a first direction X and a second direction Y). For example, the stage 10 may be configured to receive the substrate W, and may move in the first direction X and the second direction Y to adjust the position of the substrate W for irradiation.

The light source 20 may be configured to generate laser beams 22 and to provide the laser beams 22 onto the substrate W. Each of the laser beams 22 may include a continuous wave laser beam or a pulse wave laser beam. For example, the light source 20 may be configured to include nine laser devices for outputting the laser beams 22 onto the surface of the substrate W. In an example embodiment of the present inventive concept, the light source 20 may include first to third lower laser devices L1, L2, and L3, first to third intermediate laser devices M1, M2, and M3, and first to third upper laser devices U1, U2, and U3. The first to third lower laser devices L1, L2, and L3 may be linearly arranged in the first direction X. The first to third intermediate laser devices M1, M2, and M3 may be disposed on the first to third lower laser devices L1, L2, and L3, respectively. The first to third upper laser devices U1, U2, and U3 may be disposed on the first to third intermediate laser devices M1, M2, and M3, respectively. All of the first to third lower laser devices L1, L2, and L3, the first to third intermediate laser devices M1, M2, and M3, and the first to third upper laser devices U1, U2, and U3 may provide the laser beams 22, which have the same intensities or the same output powers, to the optical delivery system 30. In an example embodiment of the present inventive concept, the first to third lower laser devices L1, L2, and L3 linearly arranged in the first direction X, the first to third intermediate laser devices M1, M2, and M3 linearly arranged in the first direction X, and the first to third upper laser devices U1, U2, and U3 linearly arranged in the first direction X may be together two-dimensionally arranged to constitute a planar light source.

The optical delivery system 30 may be disposed between the light source 20 and the stage 10, and may be configured to deliver the laser beams 22 to the homogenizing system 40. The optical delivery system 30 may be configured to adjust a diameter D1 of each of the laser beams 22. In an example embodiment of the present inventive concept, the optical delivery system 30 may include first delivery mirrors 31, attenuators 32, beam expanders 34, phase shifters 35, second delivery mirrors 36, third delivery mirrors 38, and a fourth delivery mirror 39. When each of the laser beams 22 propagates along its optical path in the optical delivery system 30, its diameter may be continually changing, for example, may be increased or decreased by each of the beam expanders 34 in the optical delivery system 30.

The first delivery mirrors 31 may be disposed between the light source 20 and the attenuators 32, and may be used to change a propagation direction of the laser beams 22. For example, the first delivery mirrors 31 may exhibit a high reflectivity for the laser beams 22. The first delivery mirrors 31 may be formed of or include a dielectric material. Each of the first delivery mirrors 31 may have a hemispherical shape.

The attenuators 32 may be disposed between the first delivery mirrors 31 and the second delivery mirrors 36, and may be configured to reduce the output power of the laser beams 22, and thus may protect the second delivery mirrors 36, the third delivery mirrors 38, and the fourth delivery mirror 39. For example, the laser beams 22 may be reduced to have the desired output power after passing the attenuator 32.

The beam expanders 34 may be disposed between the attenuators 32 and the second delivery mirrors 36, and may be used to adjust the diameter D1 (e.g., see FIG. 2) of the laser beams 22. The beam expanders 34 may increase or reduce, for example, the diameter D1 of the laser beam 22. In an example embodiment of the present inventive concept, each of the beam expanders 34 may include a prism. In an example embodiment of the present inventive concept, each of the beam expanders 34 may be a multiple-prism beam expander including two or more prisms, for example two to five prisms.

The phase shifters 35 may be disposed between the beam expanders 34 and the second delivery mirrors 36, and may be configured to cause a change in phase of the laser beams 22. For example, the phase shifters 35 may shift the phase of the laser beams 22 by $\lambda/2$. If the phase shifter 35 is rotated by $\theta$ relative to a propagation direction of the laser beam, a polarization direction of an incident light may be rotated by $2\theta$.

The second delivery mirrors 36 may be disposed between the phase shifters 35 and the third delivery mirrors 38, and may reflect the laser beams 22 to the third delivery mirrors 38. The second delivery mirrors 36 may be configured to collimate the laser beams 22, and may be formed of or include a dielectric material. The second delivery mirrors 36 may have a hemispherical shape or a semicircular plate shape. The second delivery mirrors 36 of the hemispherical shape may reflect the laser beams 22 of the first lower laser device L1, the first intermediate laser device M1, and the first upper laser device U1 to the third delivery mirror 38. The second delivery mirrors 36 of the semicircular plate shape may reflect the laser beams 22 of the second and third lower laser devices L2 and L3, the second and third intermediate laser devices M2 and M3, and the second and third upper laser devices U2 and U3 to the third delivery mirrors 38. For example, the second delivery mirrors 36 of the semicircular plate shape may be configured to adjust a distance between the laser beams 22, for example, two adjacent ones of the laser beams 22, to a distance D2 (e.g., see FIG. 2) of about 2 mm. Here and throughout the specification, the term "about" is to accommodate the minor variations that may be appropriate to secure the present inventive concept. In an example embodiment of the present inventive concept, the first delivery mirrors 31 may have a hemispherical shape, and the second delivery mirrors 36 may have a semicircular plate shape.

The third delivery mirrors 38 may be disposed between the second delivery mirrors 36 and the fourth delivery mirror 39, may reflect the laser beams 22 to the fourth delivery mirror 39, and may be formed of or include a dielectric material. The third delivery mirrors 38 may have a hemispherical shape or a semicircular plate shape. The third delivery mirror 38 of the hemispherical shape may reflect the laser beams 22 of the first to third upper laser devices U1, U2, and U3 to the fourth delivery mirror 39. The third delivery mirrors 38 of the semicircular plate shape may reflect the laser beams 22 of the first to third lower laser devices L1, L2, and L3 and the first to third intermediate laser devices M1, M2, and M3 to the fourth delivery mirror 39. The third delivery mirrors 38 of the semicircular plate shape may be configured to adjust a distance between the laser beams 22 to the distance D2 (e.g., FIG. 2) of about 2 mm. For example, each of the laser beams 22 output from each of the first to third lower laser devices L1, L2, and L3, the first to third intermediate laser devices M1, M2, and M3, and the first to third upper laser devices U1, U2, and U3 may be collimated by the corresponding one of the nine (e.g., three with hemispherical shape and six with semicircular plate shape) second delivery mirrors 36 and reflected by the corresponding one of the three (e.g., one with hemispherical shape and two with semicircular plate shape) third delivery mirrors 38 to the fourth delivery mirror 39, and the distance between any two adjacent ones of the laser beams 22 reflected by the third delivery mirrors 38 may be adjusted to about 2 mm by the arrangements of the second delivery mirrors 36 and the third delivery mirrors 38. However, the present inventive concept is not limited thereto. For example, the number of the second delivery mirrors 36 may be more than nine and/or the number of the third delivery mirrors 38 may be more than three. In the case where the distance D2 between any two adjacent ones of the laser beams 22 is smaller than about 2 mm, the laser beams 22 may be provided to edge regions of the second and third delivery mirrors 36 and 38 of the semicircular plate shape, thereby causing damage of the second and third delivery mirrors 36 and 38. In an example embodiment of the present inventive concept, each of the third delivery mirrors 38 may have a semicircular plate shape.

The fourth delivery mirror 39 may be disposed between the third delivery mirror 38 and the homogenizing system 40, and may reflect the laser beams 22 to the homogenizing system 40. The fourth delivery mirror 39 may include a plate mirror, which is formed of, for example, a dielectric material.

The homogenizing system 40 may be disposed between the fourth delivery mirror 39 of the optical delivery system 30 and the stage 10, and may be configured to mix and homogenize the laser beams 22. For example, the homogenizing system 40 may be used to enhance the uniformity of the spread of the energy of the laser beams 22. In an example embodiment of the present inventive concept, the homogenizing system 40 may include array lenses 42, condenser lens 44, a shutter 46, and a field lens 48.

The array lenses 42 may be disposed between the optical delivery system 30 and the condenser lens 44. In an example embodiment of the present inventive concept, a pair of the array lenses 42 may be provided. Each of the array lenses 42 may be, for example, a fly-eye lens. In an example embodiment of the present inventive concept, each of the array lenses 42 may have a plurality of lens cells 41. For example, the fly-eye lens may include the lens cells 41 arranged in a two-dimensional plane in the first direction X and the second direction Y. The lens cells 41 may be configured to allow the laser beams 22 to pass therethrough, and thus homogenize the laser beams 22. In an example embodiment of the present inventive concept, the array lenses 42 may include a first array lens 422 and a second array lens 424. The first array lens 422 may be disposed between the fourth delivery mirror 39 and the second array lens 424. The second array lens 424 may be disposed between the first array lens 422 and the condenser lens 44.

Figure 2:
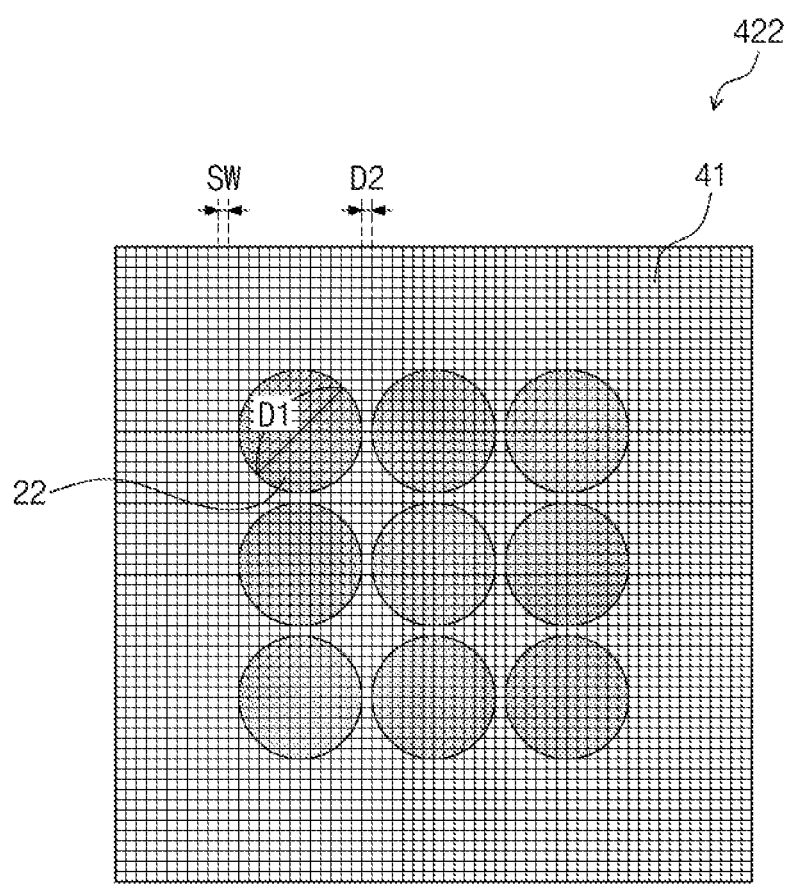
FIG. 2 is a plan view illustrating an example of laser beams provided in a first array lens of FIG. 1.

FIG. 2 illustrates an example of the laser beams 22 provided to the first array lens 422 of FIG. 1.

Referring to FIG. 2, each of the laser beams 22 may be provided to a plurality of the lens cells 41 of the first array lens 422. In an example embodiment of the present inventive concept, the laser beams 22 may be arranged in a matrix shape. In an example embodiment of the present inventive concept, the diameter D1 of each of the laser beams 22 may be about 10 to 12 times a width SW of the lens cells 41. Each of the lens cells 41 may have a square shape, and may have the width SW ranging from about 1 mm to about 3 mm. For example, each of the lens cells 41 may have the width SW of about 2 mm. The diameter D1 of each of the laser beams 22 may range from about 20 mm to about 24 mm.

The space D2 between the laser beams 22 may correspond to the width SW of each of the lens cells 41. For example, the space D2 between the laser beams 22 may be about 2 mm. In the case where the space D2 between the laser beams 22 is larger than about 2 mm, the percentile distribution and homogeneity of the laser beams 22 may be deteriorated. In the case where the distance D2 between two adjacent ones of the laser beams 22 is smaller than about 2 mm, the laser beams 22 may be provided to edge regions of the second and third delivery mirrors 36 and 38 of the semicircular plate shape, thereby causing damage of the second and third delivery mirrors 36 and 38. In the case where the laser beams 22 are partially overlapped with each other, an optical component (e.g., an array lens and so forth) at a region, to which the overlapped laser beams 22 are provided, may be damaged by a high energy from the overlapped laser beams 22.

Figure 3:
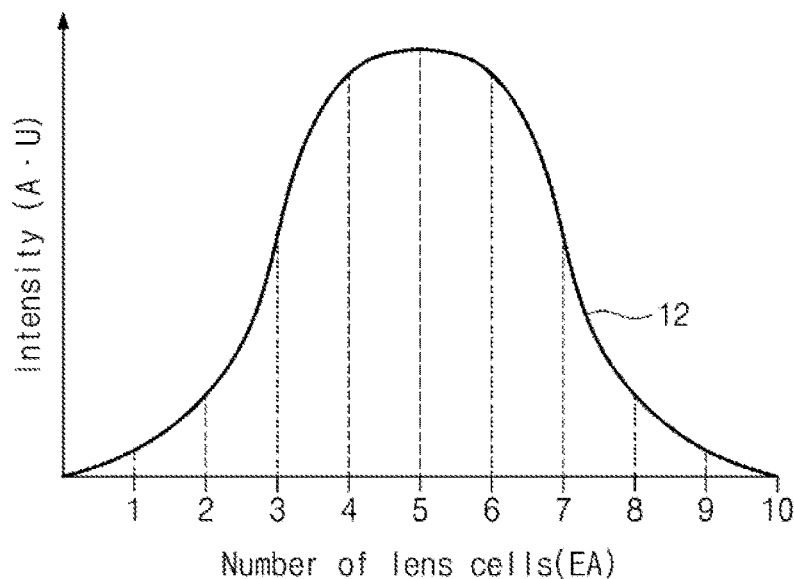
FIG. 3 is a graph showing an intensity distribution of laser beams versus the number of lens cells shown in FIG. 2.

FIG. 3 is a graph showing an intensity distribution of the laser beams 22 versus the number of the lens cells 41 of FIG. 2.

Referring to FIG. 3, the lens cells 41 may divide and/or separate the laser beams 22, according to their positions. If the number of the lens cells 41 is increased, the laser beams 22 may be more finely divided. For example, in the representative intensity distribution graph shown in FIG. 3, the laser beam 22 includes 10 lens cells 41 from one edge to the other edge across the center of the laser beam 22.

Referring back to FIGS. 1 and 2, the laser beams 22, which are divided in the first array lens 422, may be additionally divided by the second array lens 424, and in this case, the laser beams 22 may be homogenized.

Figure 4:
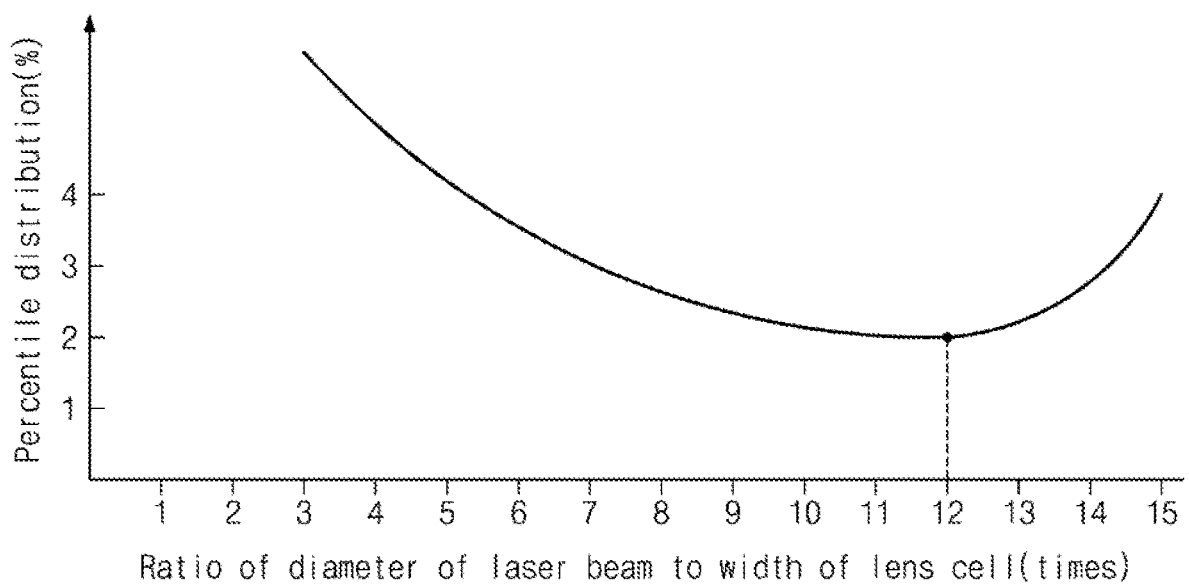
FIG. 4 is a graph showing a percentile distribution versus a ratio of a diameter of each of the laser beams to a width of the lens cells of FIG. 2.

FIG. 4 shows percentile distribution versus a ratio of the diameter D1 of the laser beam 22 to the width SW of the lens cells 41 of FIG. 2.

Referring to FIG. 4, the percentile distribution of the laser beams 22 may be inversely proportional to a ratio of the diameter D1 of the laser beam 22 to the width SW of the lens cells 41, for example, may decrease with the increase of the ratio. For example, the beam expanders 34 of the optical delivery system 30 may be configured in such a way that each of the laser beams 22 has the diameter D1 that is about 10 to 12 times the width SW of the lens cell 41, and in this case, the percentile distribution of the laser beams 22 may be enhanced, for example, may be minimized. For example, the percentile distribution of the laser beams 22 may have a minimum around a range in which the ratio of the diameter of each of the laser beams 22 to the width SW of the lens cell 41 is from about 10 to about 12. The percentile distribution may be reduced, and the homogeneity may be increased. In the case where the diameter D1 of the laser beam 22 is larger than 13 times of the width SW of the lens cells 41, the laser beams 22 may produce an interference pattern, which deteriorates the percentile distribution and the homogeneity. In other words, when the percentile distribution starts to increase, the width SW of the lens cell 41 may be smaller than about 1/12 to 1/10 times the diameter D1 of the laser beam 22.

Figure 5:
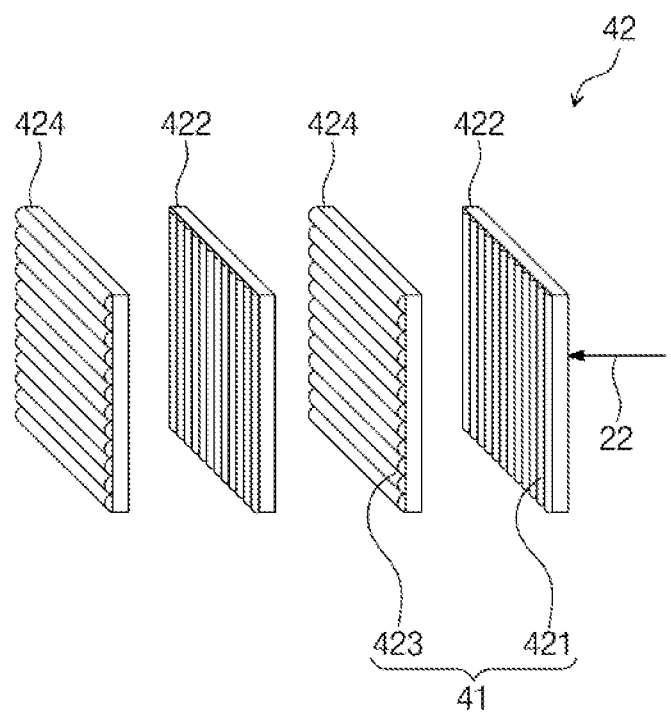
FIG. 5 is a perspective view illustrating an example of the array lenses of FIG. 1.

FIG. 5 illustrates an example of the array lenses 42 of FIG. 1.

Referring to FIG. 5, the array lenses 42 may be a cylindrical array lens. In an example embodiment of the present inventive concept, the array lenses 42 may include the first array lenses 422 and the second array lenses 424. The first array lenses 422 and the second array lenses 424 may be alternately disposed in a propagation direction of the laser beam 22, and may have the lens cells 41. Each of the lens cells 41 may have a pillar shape.

The lens cells 41 may include first lens cells 421 and second lens cells 423. For example, the first lens cells 421 may have a vertical pillar shape. The second lens cells 423 may have a shape different from that of the first lens cells 421, and may have a horizontal pillar shape. For example, the first lens cells 421 having the vertical pillar shape and the second lens cells 423 having the horizontal pillar shape may be disposed orthogonally as shown in FIG. 5. The pillar direction of the first lens cells 421 and the pillar direction of the second lens cells 423 may be perpendicular to the direction of the laser beams 22. The first array lenses 422 may have the first lens cells 421, and the second array lenses 424 may have the second lens cells 423.

Figure 6:
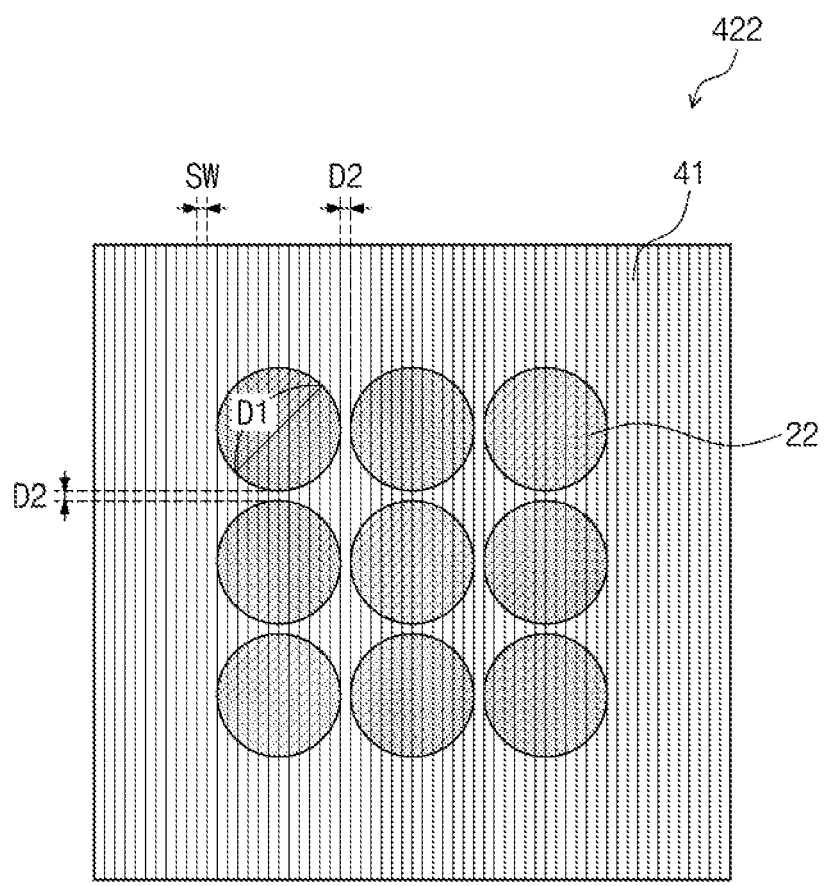
FIG. 6 is a plan view illustrating laser beams, which are irradiated onto first lens cells of a first array lens of FIG. 5.

FIG. 6 illustrates the laser beams 22, which are irradiated onto the first lens cells 421 of the first array lens 422 of FIG. 5.

Referring to FIG. 6, the diameter D1 of each of the laser beams 22 may be about 10 to 12 times the width SW of the first lens cell 421. For example, the beam expanders 34 of the optical delivery system 30 may be configured in such a way that each of the laser beams 22 has the diameter D1 that is about 10 to 12 times the width SW of the lens cells 41, and in this case, the percentile distribution and the homogeneity may be enhanced, for example, lower percentile distribution and better homogeneity. For example, the laser beams 22 may have a percentile distribution at about the lowest range and the homogeneity at about the best range when the diameter D1 of each of the laser beams 22 is about 10 to 12 times the width SW of the lens cells 41.

The array lenses 42 may enhance the percentile distribution according to an increase of the number of the laser beams 22.

Figure 7:
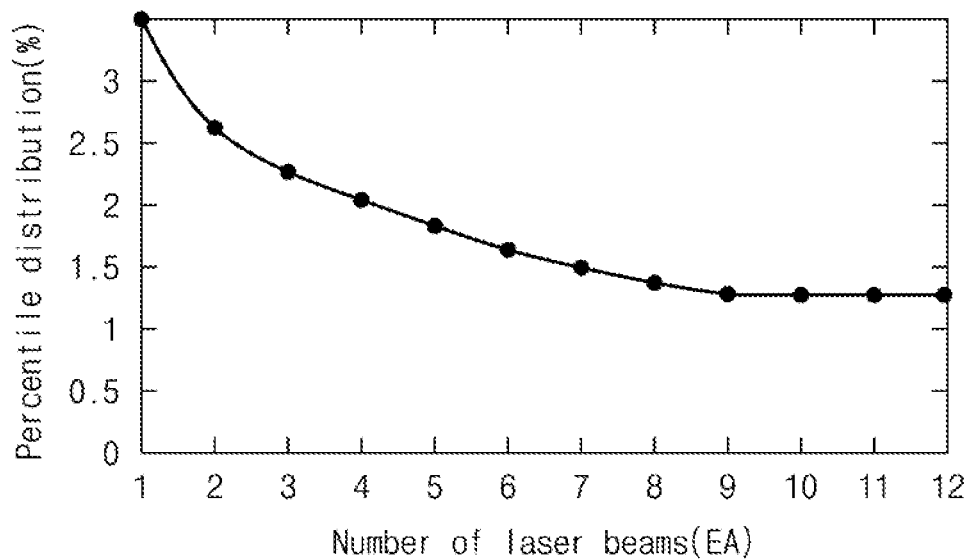
FIG. 7 is a graph showing percentile distribution versus the number of the laser beams of FIG. 1.

FIG. 7 shows percentile distribution versus the number of the laser beams 22 of FIG. 1.

Referring to FIG. 7, the percentile distribution of the laser beams 22 may be inversely proportional to the number of the laser beams 22. In the case where the number of the laser beams 22 is greater than or equal to about nine, the percentile distribution may be saturated. That is, nine or more laser beams 22 may enhance their percentile distribution maximally. For example, the percentile distribution of the laser beams 22 may reach a minimum range or a range close to the minimum range when the number of the laser beams 22 is 9 or greater. Each of the laser beams 22 may be a continuous wave laser beam or a pulse wave laser beam. In an example embodiment of the present inventive concept, when the laser beams 22 are pulse wave laser beams, a controller may be used to synchronize pulses of the laser beams 22 from all of the first to third lower laser devices L1, L2, and L3, the first to third intermediate laser devices M1, M2, and M3, and the first to third upper laser devices U1, U2, and U3 shown in FIG. 1.

Figure 8:
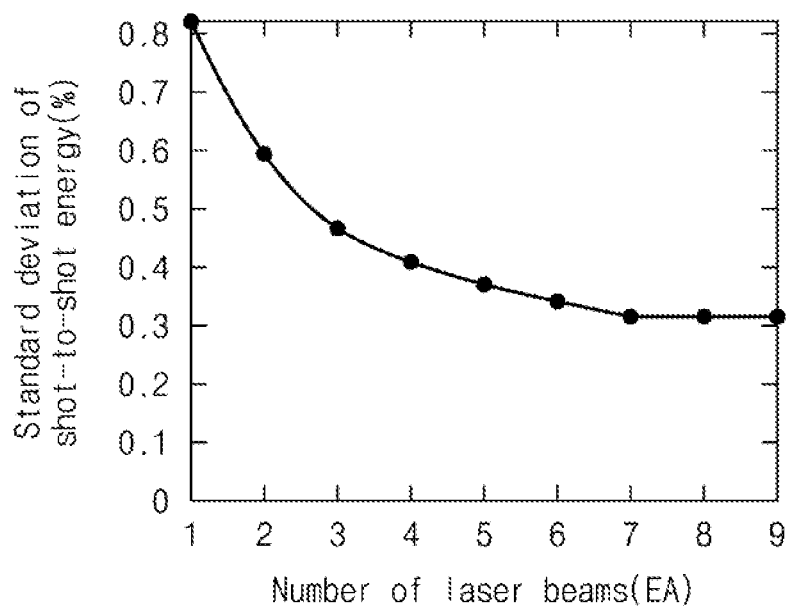
FIG. 8 is a graph showing a standard deviation of a shot-to-shot energy versus the number of the laser beams of FIG. 1.

FIG. 8 shows a standard deviation of a shot-to-shot energy versus the number of the laser beams 22 of FIG. 1.

Referring to FIG. 8, the standard deviation of the shot-to-shot energy may be inversely proportional to the number of the laser beams 22. The standard deviation of the shot-to-shot energy may be saturated, for seven or more laser beams 22 as shown in FIG. 8, while the percentile distribution may be saturated, for nine or more laser beams 22 as shown in FIG. 7. Each of the laser beams 22 may be a pulsed wave laser beam. The standard deviation of the shot-to-shot energy may vary depending on the number of the laser beams 22, for a plurality of shots and a reference energy, and may correspond to the percentile distribution. For example, when the number of the laser beam 22 is one, an energy of the one laser beam 22 may correspond to the reference energy, and the shot-to-shot energy may have the highest standard deviation. When about 263 shots are made using one laser beam 22, the shot-to-shot energy may have the standard deviation of about 0.8%. When the number of the laser beams 22 is two, a total energy of the two laser beams 22 may correspond to the reference energy, and the standard deviation of the shot-to-shot energy of the two laser beams 22 may decrease. When about 263 shots are made using the two laser beams 22, the shot-to-shot energy may have the standard deviation of about 0.6%. When the number of the laser beams 22 is seven, a total energy of the seven laser beams 22 may correspond to a reference energy. When about 263 shots are made using the seven laser beams 22, the shot-to-shot energy may have the standard deviation of about 0.32%. When the number of the laser beams 22 is greater than or equal to seven, the standard deviation of the shot-to-shot energy may be saturated. In other words, when the number of the laser beams 22 is greater than or equal to seven, the standard deviation for their energies may be minimized. Since the standard deviation of the shot-to-shot energy may be saturated, for seven or more laser beams 22, and the percentile distribution may be saturated, for nine or more laser beams 22, when the number of the laser beams 22 is seven or greater, for example, nine or greater, the standard deviation of the shot-to-shot energy and the percentile distribution may have a minimum value or close to the minimum value.

Figure 9:
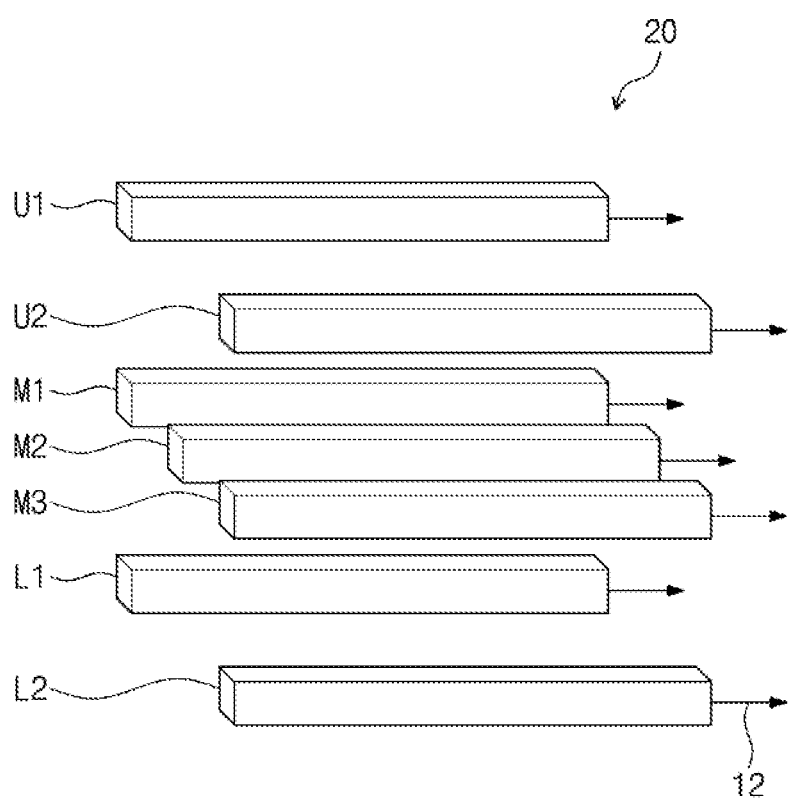
FIG. 9 is a diagram showing an example of a light source of FIG. 1.

FIG. 9 illustrates an example of the light source 20 of FIG. 1.

Referring to FIG. 9, the light source 20 may include seven laser devices. In an example embodiment of the present inventive concept, the light source 20 may include the first and second lower laser devices L1 and L2, the first to third intermediate laser devices M1, M2, and M3, and the first and second upper laser devices U1 and U2. The first and second lower laser devices L1 and L2, the first to third intermediate laser devices M1, M2, and M3, and the first and second upper laser devices U1 and U2 may provide the laser beams 22 to the optical delivery system 30 and the homogenizing system 40 and thereby may enhance the standard deviation, percentile distribution, and homogeneity of the laser beams 22. In an example embodiment of the present inventive concept, the first and second lower laser devices L1 and L2 linearly arranged in the first direction X, the first to third intermediate laser devices M1, M2, and M3 linearly arranged in the first direction X, and the first and second upper laser devices U1 and U2 linearly arranged in the first direction X may be together two-dimensionally arranged to constitute a planar light source. As shown in FIGS. 7 and 8, seven or more laser beams 22 may be used to enter the array lenses 42 to significantly increase the uniformity and reduce shot-to-shot variation of the laser beams 22 irradiated onto the substrate W. In an example embodiment of the present inventive concept, the laser beams 22 may be arranged in a hexagonal shape. In other words, when multiple laser devices (e.g., seven or greater) are used, not only the uniformity of the laser beams 22 irradiated onto the substrate W may be enhanced, but also there may be an effect of enhancing shot-to-shot energy dispersion when pulsed wave laser beams are used.

Referring back to FIG. 1, the condenser lens 44 may be disposed between the array lenses 42 and the shutter 46, and may be configured to concentrate the homogenized laser beams 22 into the shutter 46 and the field lens 48.

The shutter 46 may be disposed between the condenser lens 44 and the field lens 48, and may be configured to block or interrupt the laser beams 22. For example, the shutter 46 may block the laser beams 22 by units of shot. In an example embodiment of the present inventive concept, the shutter 46 may contain an aperture controlled by an actuator to be opened to allow the laser beams 22 delivered from the condenser lens 44 to the field lens 48, or closed to block the laser beams 22.

The field lens 48 may be disposed between the shutter 46 and the mask 50, and may be configured to adjust a focal length of the laser beam 22 or a numerical aperture (NA) of the imaging optical system 60. For example, the field lens 48 may include a hemispherical or spherical lens.

The mask 50 may be disposed between the homogenizing system 40 and the stage 10. The mask 50 may adjust the beam size and/or shape of the homogenized laser beam 22. For example, the mask 50 may adjust the shape of the homogenized laser beam 22 to a rectangular shape. For example, an opening that defines the size and/or shape of the laser beam 22 may be formed in the mask 50.

The imaging optical system 60 may be disposed between the mask 50 and the stage 10, and may provide the laser beams 22 onto the substrate W. For example, the imaging optical system 60 may image the laser beams 22 on the substrate W. As an example, the imaging optical system 60 may include an eyepiece lens 62, an imaging mirror 64, and an objective lens 66.

The eyepiece lens 62 may be disposed between the mask 50 and the imaging mirror 64, and may be configured to project the laser beams 22 to the imaging mirror 64 in an enlarged manner. For example, the eyepiece lens 62 may include a concave lens.

The imaging mirror 64 may be disposed between the eyepiece lens 62 and the objective lens 66, may be used to change the propagation direction of the laser beams 22, and may reflect the laser beams 22 delivered from the eyepiece lens 62 to the objective lens 66. The imaging mirror 64 may include a plate mirror, which is formed of, for example, a dielectric material.

The objective lens 66 may be disposed between the imaging mirror 64 and the stage 10, and may be configured to project the laser beams 22 onto the substrate W, which is placed on the stage 10, in a reduction manner. For example, the objective lens 66 may include a convex lens. The homogenized laser beams 22 projected from the objective lens 66 onto the substrate W may be used to perform a thermal treatment process on at least a portion of the substrate W.

A method of fabricating a semiconductor device using the laser annealing system 100 described above will be described in more detail below.

Figure 10:
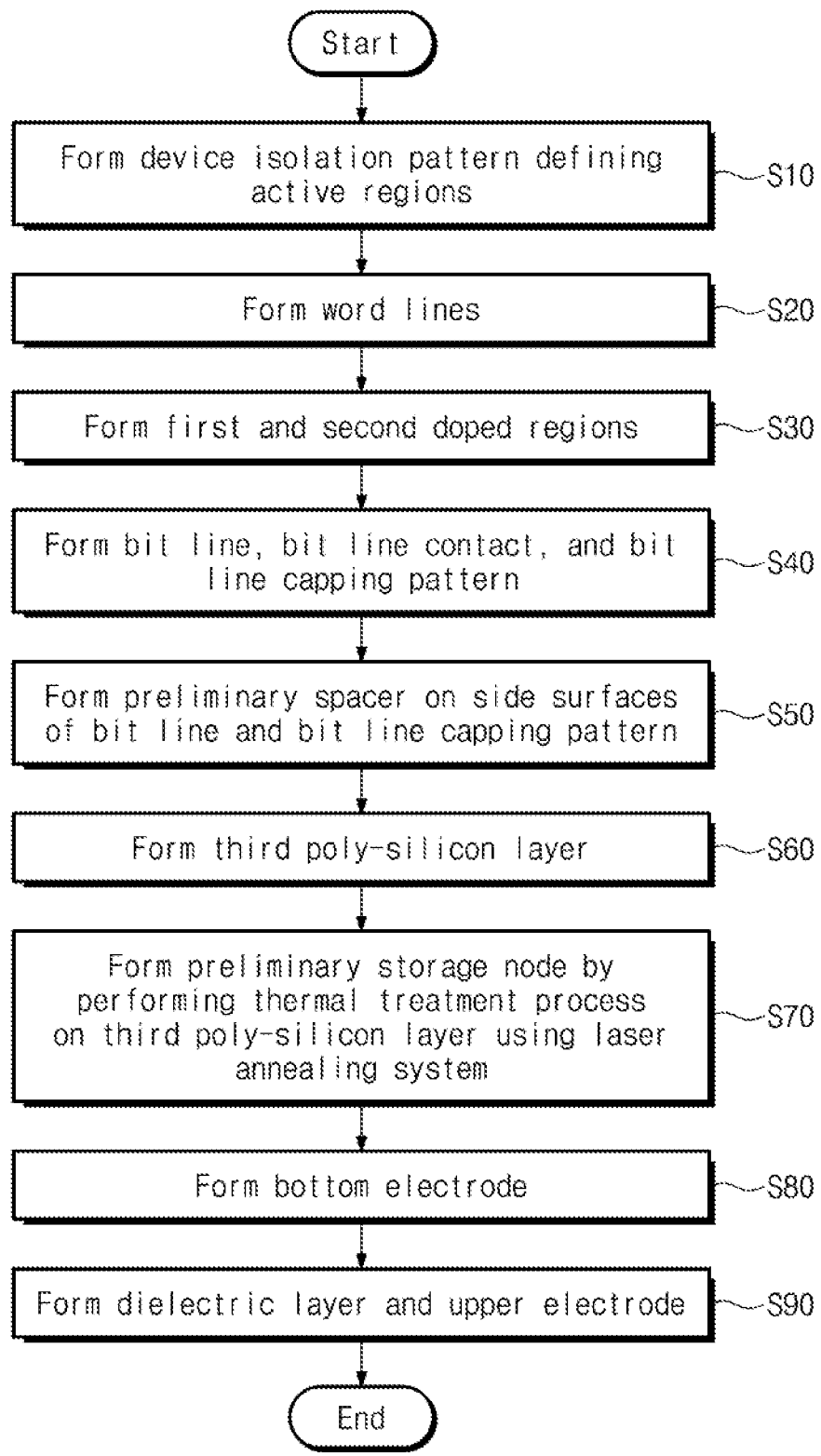
FIG. 10 is a flow chart illustrating a method of fabricating a semiconductor device, according to an example embodiment of the present inventive concept.

FIG. 10 illustrates a method of fabricating a semiconductor device, according to an example embodiment of the present inventive concept.

Referring to FIG. 10, a method of fabricating a semiconductor device, according to an example embodiment of the present inventive concept, may be used to fabricate a dynamic random access memory (DRAM) device.

FIGS. 11A to 13A, 14 to 18, and 19A to 30A are cross-sectional views, which are taken in the first direction X crossing an active region ACT of a semiconductor device, and FIGS. 11B to 13B and 19B to 30B are cross-sectional views, which are taken in the second direction Y parallel to an extension direction of the active region ACT of the semiconductor device.

Figure 11A:
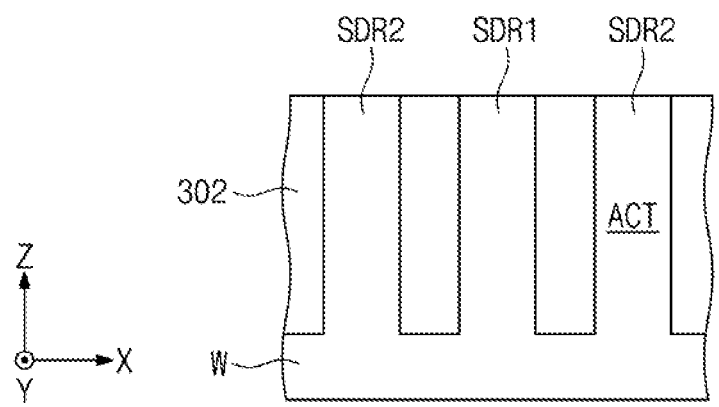
Figure 11B:
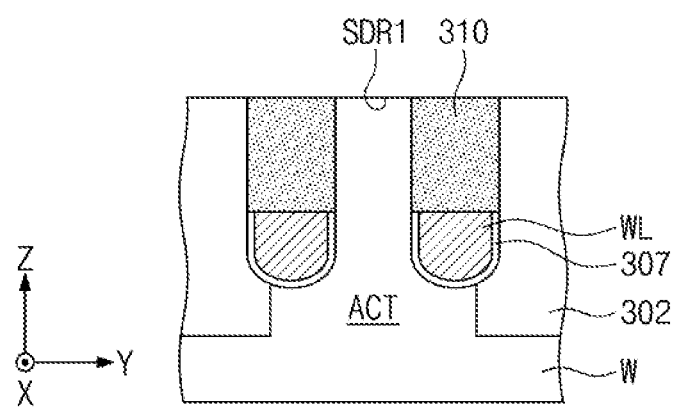

Referring to FIGS. 10, 11A, and 11B, a device isolation pattern 302 may be formed on the substrate W to define the active regions ACT (S10). A device isolation trench may be formed in the substrate W, and the device isolation patterns 302 may be formed to fill the device isolation trench. For example, the device isolation patterns 302 and the active regions ACT may be formed by a shallow trench isolation (STI) process. The device isolation patterns 302 may be formed of at least one of, for example, a silicon oxide ($SiO_2$) layer, a silicon nitride ($Si_3N_4$) layer, or a silicon oxynitride (SiON) layer. The active region ACT and the device isolation patterns 302 may be patterned to form grooves. Here, in a process of etching the substrate W and the device isolation patterns 302, the process condition may be adjusted such that an etch rate of the device isolation patterns 302 is higher than that of the substrate W. In this case, each of the grooves may be formed to have a curved bottom surface.

Next, word lines WL may be formed in the grooves (S20). For example, the bottom surfaces of the word lines WL may correspond to the floors of the grooves formed in the device isolation patterns 302 and the active regions ACT. In an example embodiment of the present inventive concept, a pair of the word lines WL may be provided to cross each of the active regions ACT, and may extend in the first direction X. The active region ACT may include a first source/drain region SDR1 and a pair of second source/drain regions SDR2, which are defined by the pair of the word lines WL. The first source/drain region SDR1 may be defined between the pair of the word lines WL, and the pair of the second source/drain regions SDR2 may be defined at opposite edge regions of the active region ACT.

Before the formation of the word lines WL, a gate dielectric layer 307 may be formed on inner surfaces of the grooves. The gate dielectric layer 307 may be formed by, for example, a thermal oxidation process, a chemical vapor deposition (CVD) process, and/or an atomic layer deposition (ALD) process. The gate dielectric layer 307 may be formed of, for example, a silicon oxide ($SiO_2$) layer, a silicon nitride ($Si_3N_4$) layer, and/or a high-k dielectric layer such as a metal oxide layer. A gate conductive layer may be formed to fill the grooves, and then, an etch-back process may be performed on the gate conductive layer to form the word lines WL. The gate conductive layer may be formed of, for example, impurity-doped polysilicon, metal nitride, and/or metal. The word lines WL may be recessed to have top surfaces that are lower than the top surfaces of the active region ACT.

Thereafter, an insulating layer (e.g., a silicon nitride (Si$_3$N$_4$) layer) may be formed on the substrate W to fill the grooves and may be etched to form a word line capping pattern 310 on each of the word lines WL.

Figure 12A:
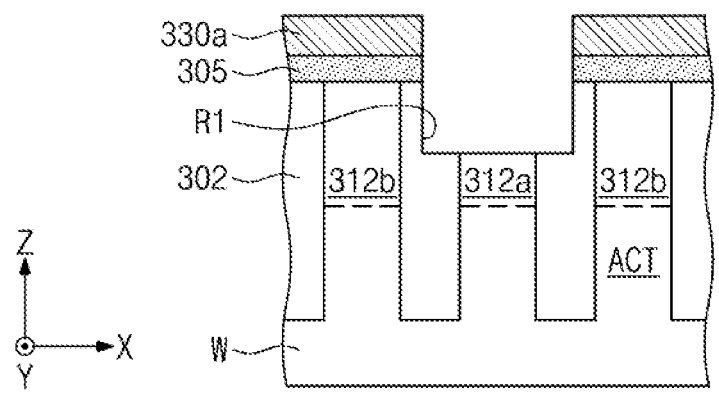
Figure 12B:
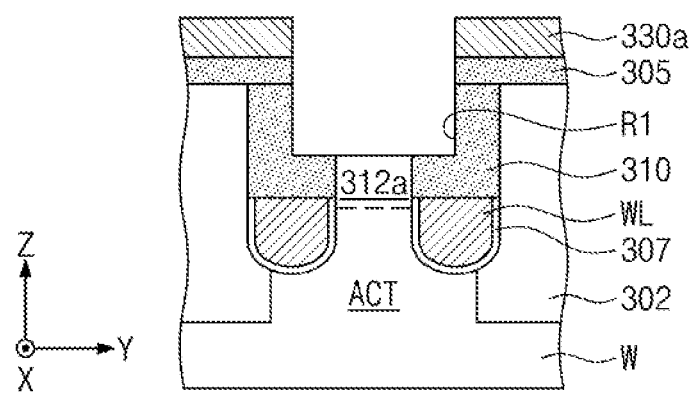

Referring to FIGS. 10, 12A, and 12B, first and second doped regions 312a and 312b may be formed by injecting dopants into the active region ACT using the word line capping patterns 310 and the device isolation pattern 302 as a mask (S30). Ion implantation process may be performed to dope the impurities into the active region ACT. The first doped region 312a and the second doped regions 312b may be formed in the first source/drain region SDR1 and the second source/drain regions SDR2, respectively. An insulating layer and a first poly-silicon layer may be sequentially formed on the substrate W. The first poly-silicon layer may be patterned to form a mask pattern 330a. A photolithography process and an etching process may be used to pattern the first polysilicon layer to form the mask pattern 330a. The insulating layer, the device isolation pattern 302, the substrate W, and the word line capping pattern 310 may be etched using the mask pattern 330a as an etch mask to form a first recess region R1 and an inter-layered insulating pattern 305. The inter-layered insulating pattern 305 may be formed as a single layer or multiple layers including at least one of, for example, a silicon oxide (SiO$_2$) layer, a silicon nitride (Si$_3$N$_4$) layer, or a silicon oxynitride (SiON) layer. The inter-layered insulating pattern 305 may include a plurality of island-shaped patterns spaced apart from each other, and may be formed to cover both of end portions of two adjacent ones of the active region ACT. The first recess region R1 may be formed to have a mesh shape, when viewed in a plan view, and may expose the first doped regions 312a. Due to the formation of the first recess region R1, a top surface of the first doped region 312a may be lower than a top surface of the second doped region 312b.

Figure 13A:
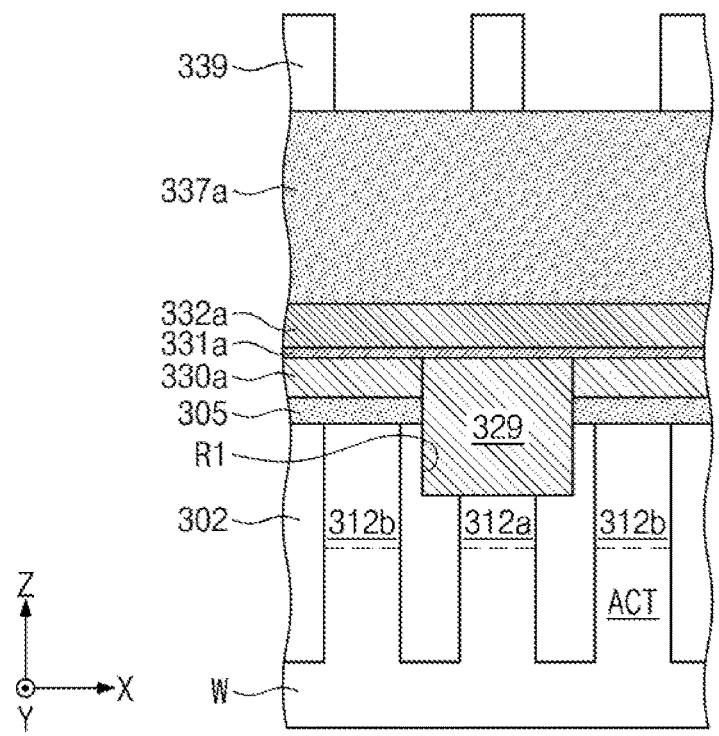
Figure 13B:
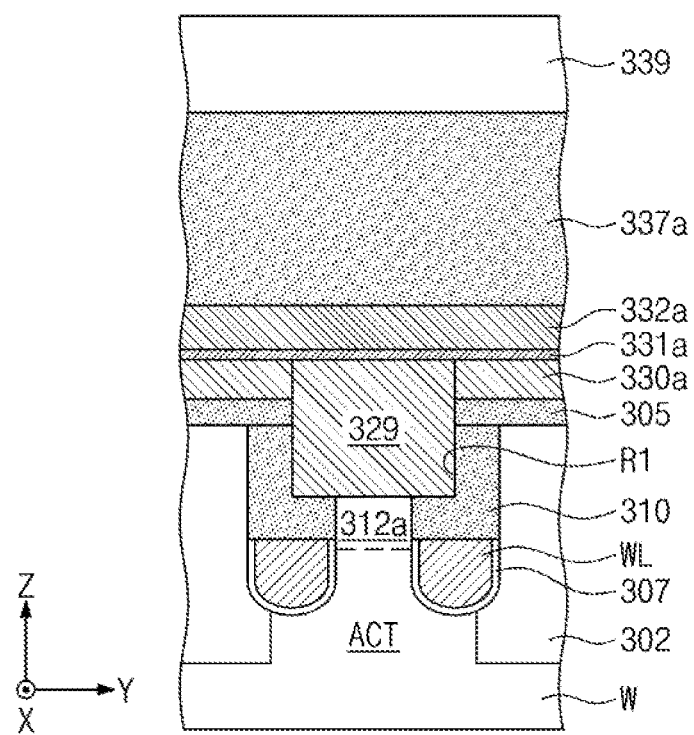

Referring to FIGS. 13A and 13B, a second poly-silicon layer 329 may be formed on the substrate W to fill the first recess region R1. Thereafter, a planarization process may be performed on the second poly-silicon layer 329 to remove the second poly-silicon layer 329 from the top surface of the mask pattern 330a and to expose the top surface of the mask pattern 330a. A bit line ohmic layer 331a, a bit line metal-containing layer 332a, and a bit line capping layer 337a may be sequentially formed on the mask pattern 330a and the second poly-silicon layer 329. The bit line ohmic layer 331a may be formed of or include at least one of metal silicides (e.g., cobalt silicide (CoSi)). The formation of the bit line ohmic layer 331a may include depositing a metal layer on the mask pattern 330a and the second poly-silicon layer 329, performing a thermal treatment process to form a metal silicide through a reaction between polysilicon, which is contained in the mask pattern 330a and the second poly-silicon layer 329, and the metal layer, and then, removing an unreacted portion of the metal layer.

First mask patterns 339, which define a planar shape of a bit line BL, may be formed on the bit line capping layer 337a. The first mask patterns 339 may be formed of a material layer such as, for example, an amorphous carbon layer (ACL), a silicon oxide (SiO$_2$) layer, or a photoresist pattern, and may have an etch selectivity with respect to the bit line capping layer 337a. For the photoresist pattern, a photolithography process may be used to form the first mask patterns 339. For the amorphous carbon layer (ACL) and the silicon oxide (SiO$_2$) layer, a photolithography process and an etching process may be used to form the first mask patterns 339.

Figure 14:
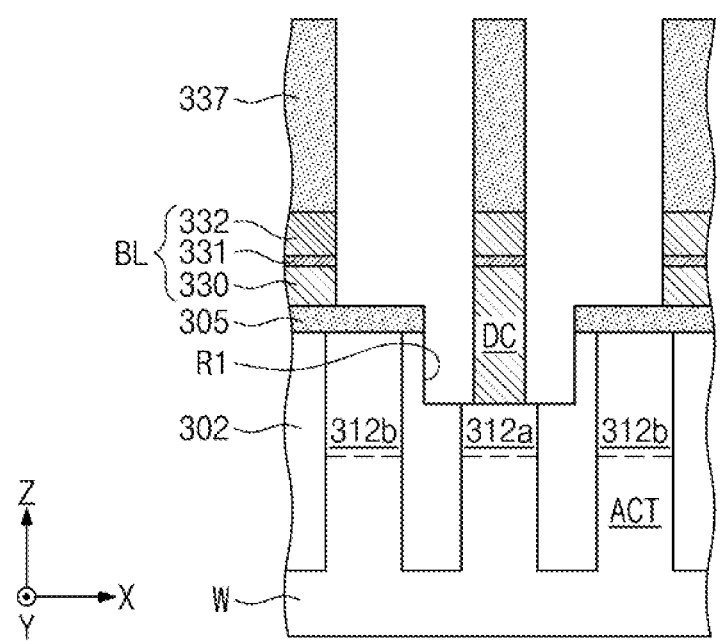

Referring to FIGS. 10 and 14, the bit line capping layer 337a, the bit line metal-containing layer 332a, the bit line ohmic layer 331a, the mask pattern 330a, and the second poly-silicon layer 329 may be sequentially etched using the first mask patterns 339 as an etch mask to form a bit line polysilicon pattern 330, a bit line ohmic pattern 331, a metal-containing bit line pattern 332, a bit line contact DC, and a bit line capping pattern 337 (S40). The bit line polysilicon pattern 330, the bit line ohmic pattern 331, and the metal-containing bit line pattern 332 may constitute the bit line BL, which extends in the second direction Y. Furthermore, the top surface of the inter-layered insulating pattern 305 and the inner side surface and the bottom surface of the first recess region R1 may be partially exposed. The first mask patterns 339 may then be removed.

Figure 15:
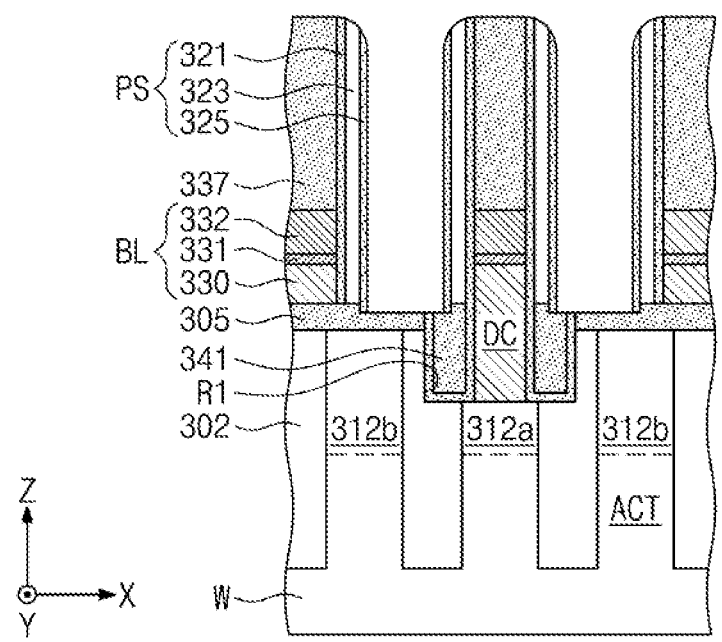

Referring to FIGS. 10 and 15, a preliminary spacer PS may be formed on the side surfaces of the bit line BL and the bit line capping pattern 337 (S50). In an example embodiment of the present inventive concept, the preliminary spacer PS may include a first sub-spacer 321, a sacrificial spacer 323, and a second sub-spacer 325. The first sub-spacer 321, the sacrificial spacer 323, and the second sub-spacer 325 may be formed using a first sub-spacer layer, a sacrificial spacer layer, and a second spacer layer, respectively. Thus, the first sub-spacer 321, the sacrificial spacer 323, and the second sub-spacer 325 may be formed to sequentially cover a sidewall of the bit line capping pattern 337 and a sidewall of the bit line BL.

The first sub-spacer layer may be conformally formed on the substrate W, and may conformally cover the bottom surface and the inner side surface of the first recess region R1. The first sub-spacer layer may be, for example, a silicon nitride (Si$_3$N$_4$) layer. An insulating layer (e.g., a silicon nitride (Si$_3$N$_4$) layer) may be formed on the substrate W to fill the first recess region R1 and may be anisotropically etched to form a lower buried insulating pattern 341 in the first recess region R1. Here, the first sub-spacer layer may be etched by an anisotropic etching process, thereby forming the first sub-spacer 321. In addition, the top surface of the inter-layered insulating pattern 305 may also be exposed after the anisotropic etching process.

Next, a sacrificial spacer layer may be conformally formed on the substrate W, and an anisotropic etching process may be performed to form the sacrificial spacer 323 covering a side surface of the first sub-spacer 321. The sacrificial spacer 323 may be formed of or include a material having an etch selectivity with respect to the first sub-spacer 321, and may be formed of or include, for example, silicon oxide (SiO$_2$).

Next, a second sub-spacer layer may be conformally formed on the substrate W, and then, an anisotropic etching process may be performed to form the second sub-spacer 325 covering a side surface of the sacrificial spacer 323. The second sub-spacer 325 may be formed of or include, for example, silicon nitride (Si$_3$N$_4$). The top surface of the inter-layered insulating pattern 305 may be exposed, after the formation of the second sub-spacer 325. The first and second sub-spacer layers, the sacrificial spacer layer and the insulating layer described above may each be formed by, for example, a chemical vapor deposition (CVD) process, and/or an atomic layer deposition (ALD) process.

Figure 16:
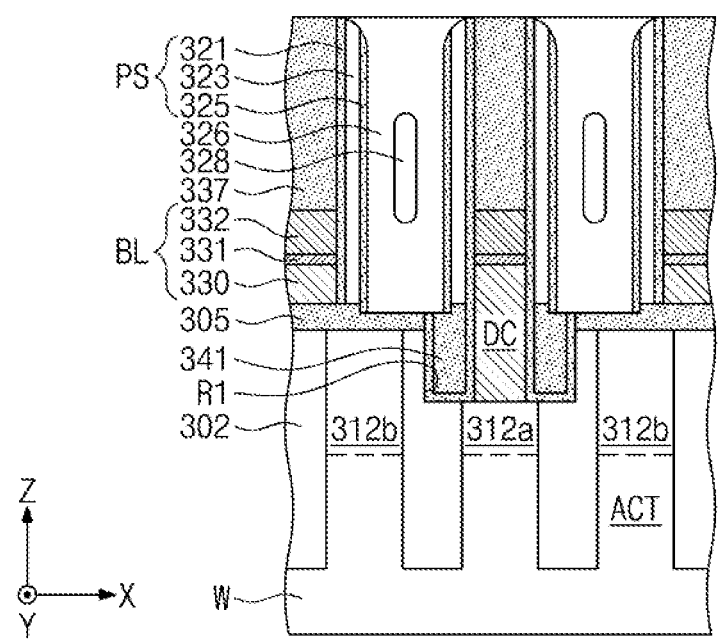

Referring to FIGS. 10 and 16, a third poly-silicon layer 326 may be formed on the entire substrate W (S60), and then, the third poly-silicon layer 326 may be planarized by an etch-back process or a chemical-mechanical polishing (CMP) process to expose top surfaces of the bit line capping patterns 337. The third poly-silicon layer 326 may be formed by a chemical vapor deposition (CVD) method, and may be formed between the preliminary spacers PS. The third poly-silicon layer 326 may have seam defects 328. For example, the third poly-silicon layer 326 cannot be sufficiently filled between the preliminary spacers PS, and thus the seam defect 328 may be generated between the preliminary spacers PS. The seam defect 328 may be formed between the bit lines BL.

Figure 17:
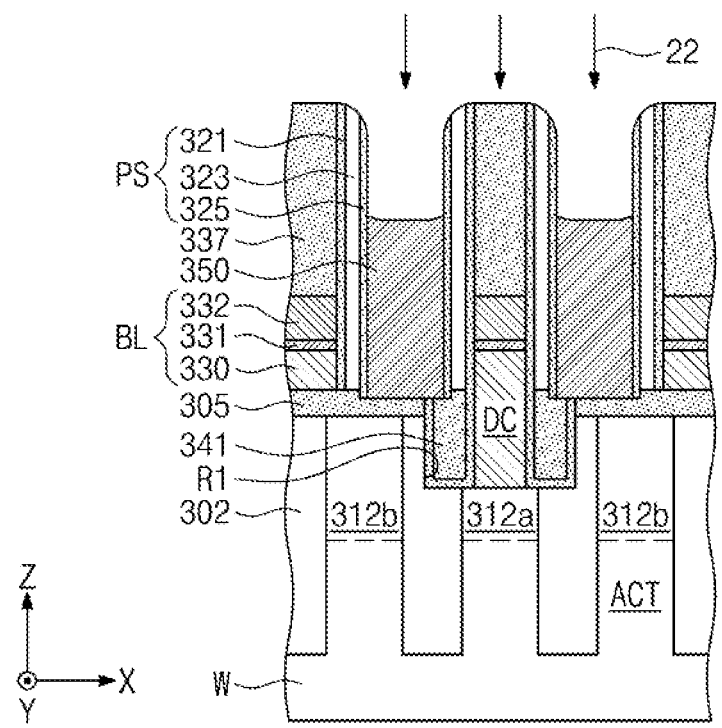

Referring to FIGS. 1, 10, and 17, a preliminary storage node contact 350 may be formed by performing a thermal treatment process on the third poly-silicon layer 326, and the thermal treatment process may be performed by the laser annealing system 100, in which the homogenized laser beams 22 are used (S70). For example, the preliminary storage node contact 350 may be uniformly annealed by the laser beams 22 of the laser annealing system 100. The laser beams 22 may be used to melt the third poly-silicon layer 326, and in this case, when the third poly-silicon layer 326 is cooled, the preliminary storage node contact 350 may be formed to have a crystalline structure. The seam defect 328 may be removed during this process. When the laser beam 22 having the enhanced percentile distribution of FIGS. 1 to 9 is used, the heterogeneity of the preliminary storage node contact 350 may be minimized to enhance the reliability in the removal of the seam defect 328.

Figure 18:
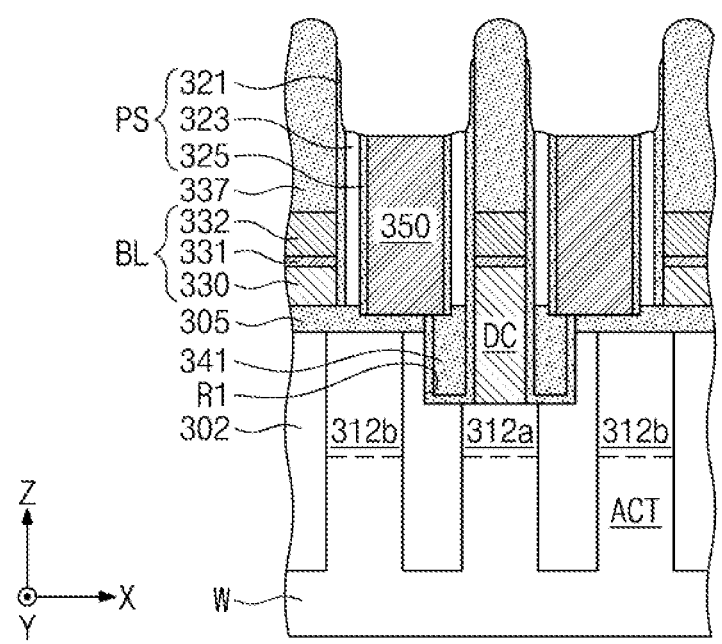

Referring to FIG. 18, an isotropic etching process may be performed to remove upper portions of the sacrificial spacer 323 and the second sub-spacer 325, and in an example embodiment of the present inventive concept, the isotropic etching process may be performed, such that top surfaces of the sacrificial spacer 323 and the second sub-spacer 325 are formed at a level similar to a top surface of the preliminary storage node contact 350. In an example embodiment of the present inventive concept, an upper side surface of the first sub-spacer 321 may be exposed by the isotropic etching process. In this case, it may be possible to increase a process margin in a subsequent process of forming the landing pad. An upper portion of the first sub-spacer 321 may also be partially removed, when the upper portions of the sacrificial spacer 323 and the second sub-spacer 325 are removed, and in this case, the upper portion of the first sub-spacer 321 may have a reduced width. For example, the upper portions of the sacrificial spacer 323 and the second sub-spacer 325 may be partially removed to expose the sidewall of the first sub-spacer 321, and the second sub-spacer 325 may have a top end whose height (or level) is lower than that of a top end of the first sub-spacer 321.

Figure 19A:
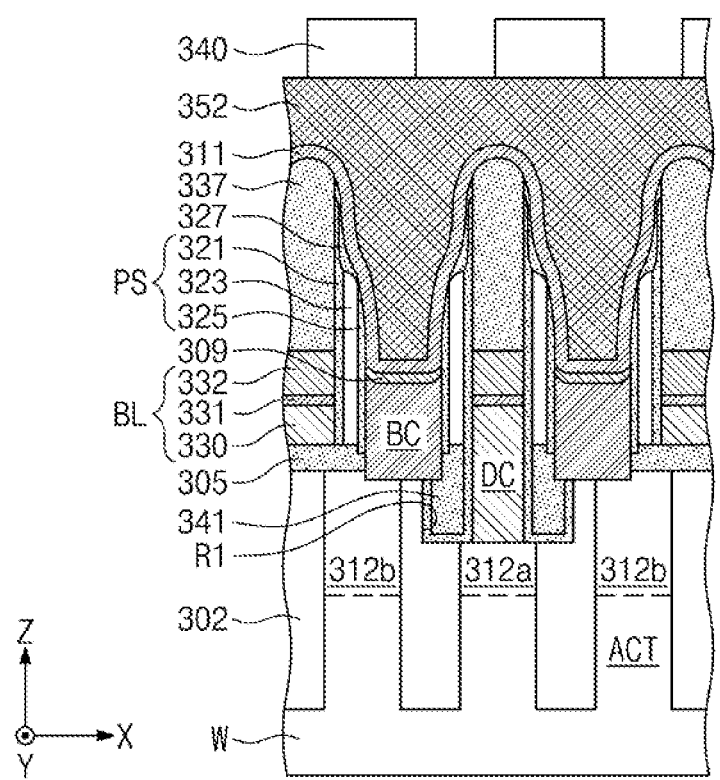
Figure 19B:
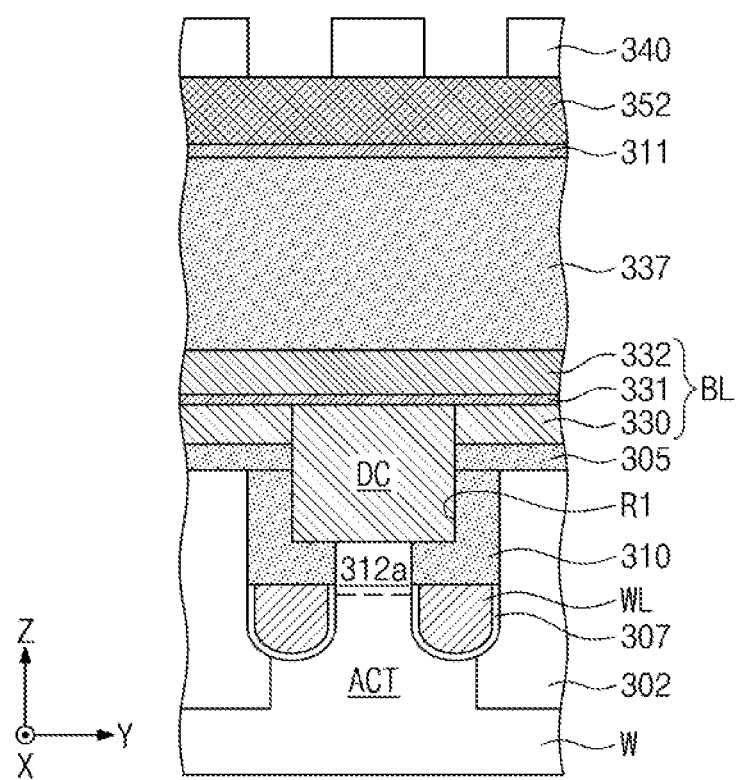

Referring to FIGS. 18, 19A, and 19B, a third sub-spacer layer may be conformally deposited on the substrate W and may be anisotropically etched to form a third sub-spacer 327, which covers an exposed upper side surface of the first sub-spacer 321. The third sub-spacer 327 may be formed of or include a material the same as that of the first sub-spacer 321 and the second sub-spacer 325. A bottom portion of the third sub-spacer 327 may cover an exposed top end of the sacrificial spacer 323. Next, the preliminary storage node contact 350 may be etched to expose an upper side surface of the second sub-spacer 325 and to form a storage node contact BC. Thus, the storage node contact BC may be formed to be adjacent to the second sub-spacer 325. The third sub-spacer 327 may be formed to reinforce a damaged upper portion of the first sub-spacer 321 and to cover the sacrificial spacer 323, and thus, the third sub-spacer 327 may be used to prevent an etchant for a process of etching the storage node contact BC and a cleaning solution for a subsequent cleaning process from infiltrating into the bit line BL. Accordingly, the bit line BL may be prevented from being damaged.

Next, a storage node ohmic layer 309 may be formed on a top surface of the storage node contact BC, and may be formed of or include at least one of metal silicides, for example, cobalt silicide (CoSi). For example, the storage node ohmic layer 309 may be formed by depositing a metal layer, such as a cobalt (Co) layer, on storage node contact BC which is a polysilicon layer, performing a heat treatment process to form a metal silicide layer, such as a cobalt silicide (CoSi) layer, by reacting the metal layer with poly-silicon of the storage node contact BC, and then removing the non-reacted portion of the metal layer. A diffusion barrier layer 311 may be conformally formed on the substrate W, and may be formed of, for example, a titanium nitride (TiN) layer or a tantalum nitride (TaN) layer. A landing pad layer 352 may be formed on the substrate W to fill a region between the bit line capping patterns 337, and may be formed of or include, for example, tungsten (W). Second mask patterns 340 may be formed on the landing pad layer 352, and may be formed of, for example, an amorphous carbon layer (ACL). For example, an amorphous carbon layer (ACL) may be formed on the landing pad layer 352, then a photolithography process and an etching process may be used to pattern the amorphous carbon layer (ACL) to form the second mask patterns 340. The second mask pattern 340 may define a position of a landing pad which will be formed by a subsequent process, and may be formed to overlap the storage node contacts BC, when viewed in a plan view.

Figure 20A:
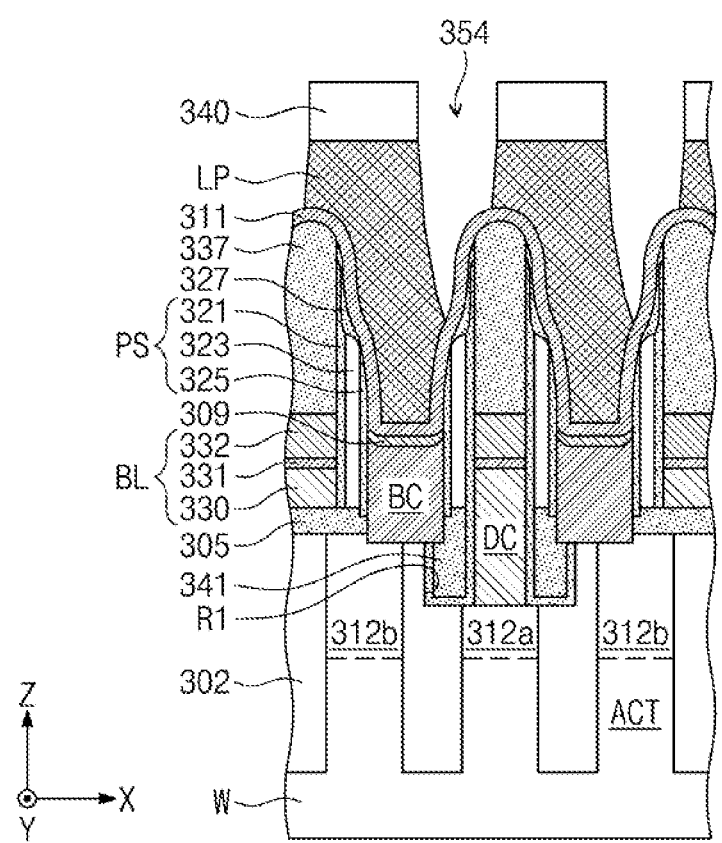
Figure 20B:
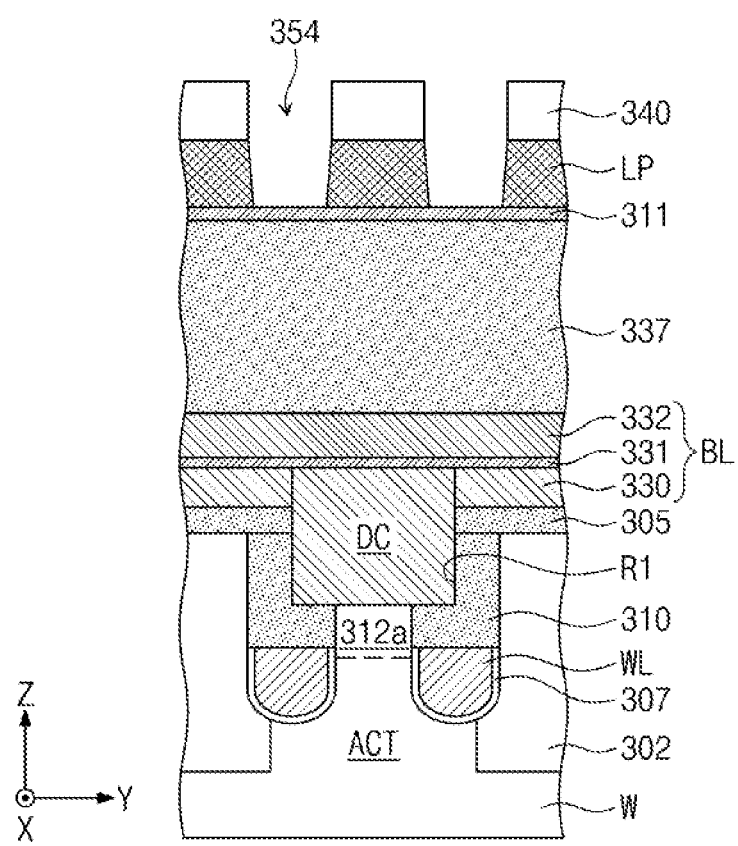

Referring to FIGS. 20A and 20B, an anisotropic etching process may be performed using the second mask patterns 340 as an etch mask to remove a portion of the landing pad layer 352. Thus, landing pads LP may be formed, and openings 354 may be formed to expose the diffusion barrier layer 311. The landing pad LP may be electrically connected to the storage node contact BC.

Figure 21A:
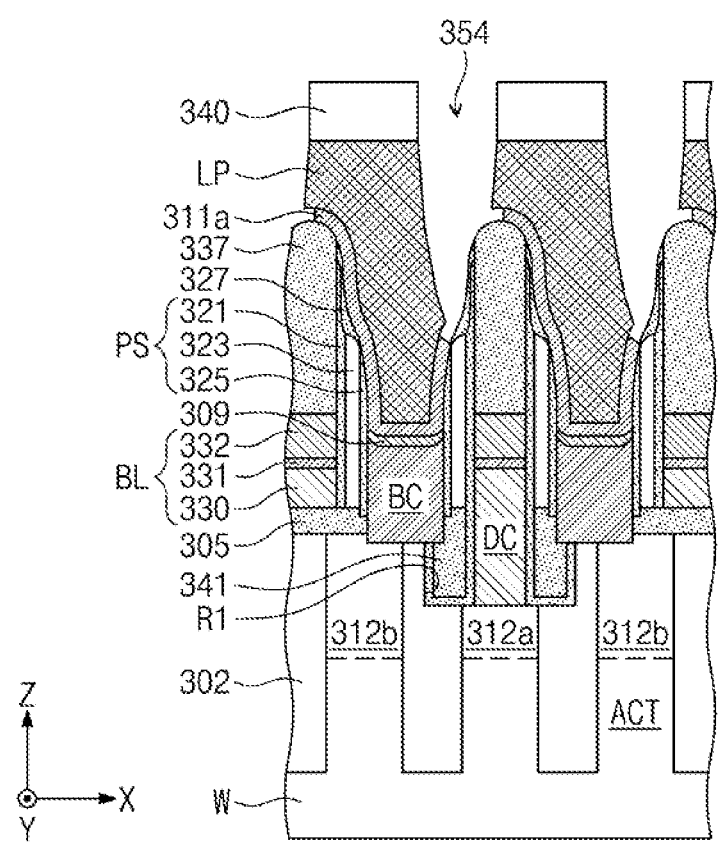
Figure 21B:
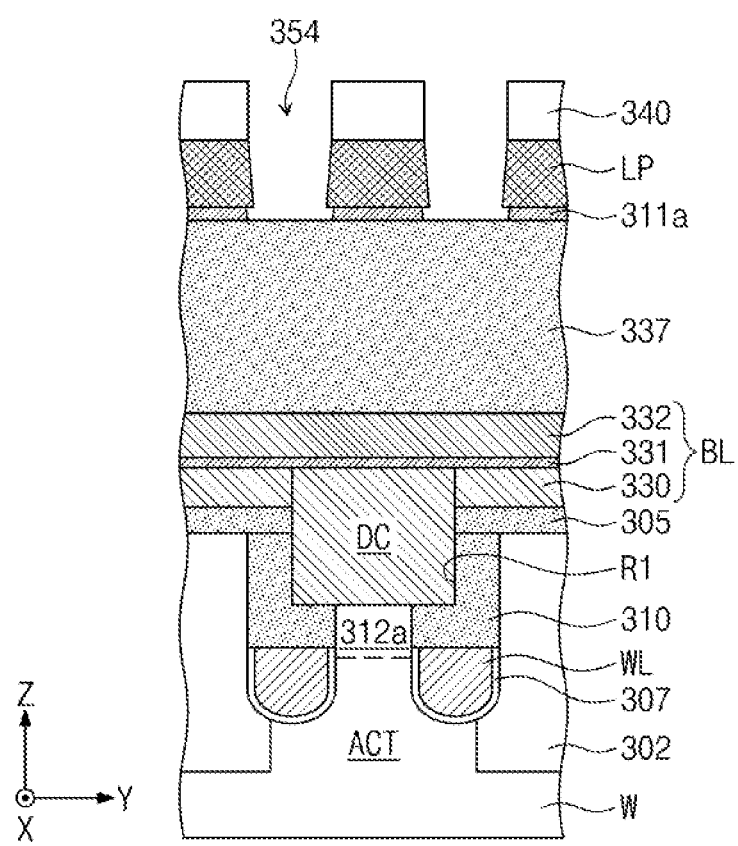

Referring to FIGS. 21A and 21B, an isotropic etching process may be performed to remove the diffusion barrier layer 311 exposed through the openings 354. Thus, diffusion barrier patterns 311a, which are spaced apart from each other, may be formed to expose portions of top surfaces of the bit line capping patterns 337 and the third sub-spacers 327. In an example embodiment of the present inventive concept, the isotropic etching process may be performed to etch the diffusion barrier patterns 311a in an over-etching manner, and in this case, the bottom surface of the landing pad LP may be partially exposed.

Figure 22A:
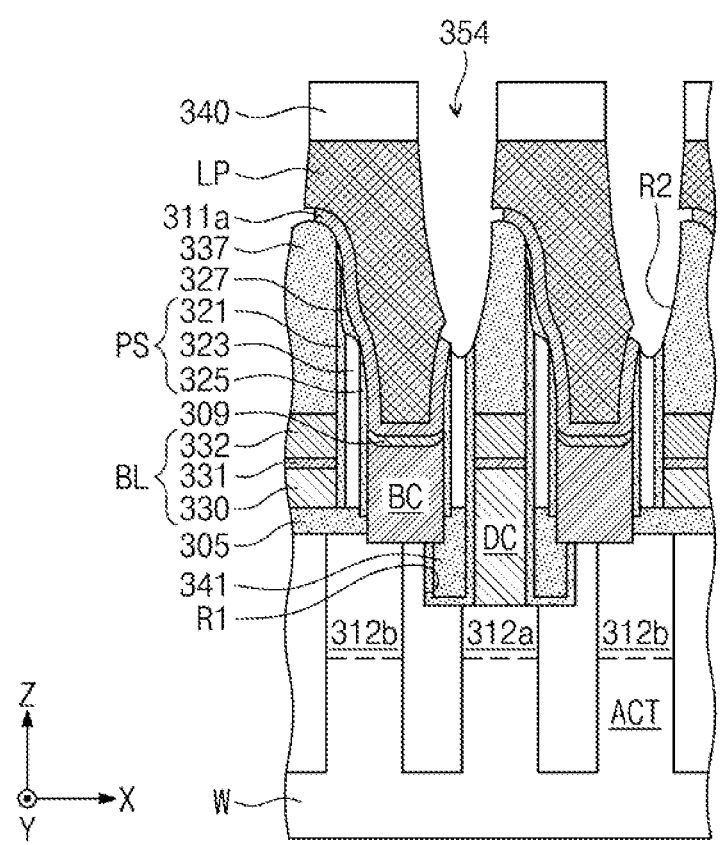
Figure 22B:
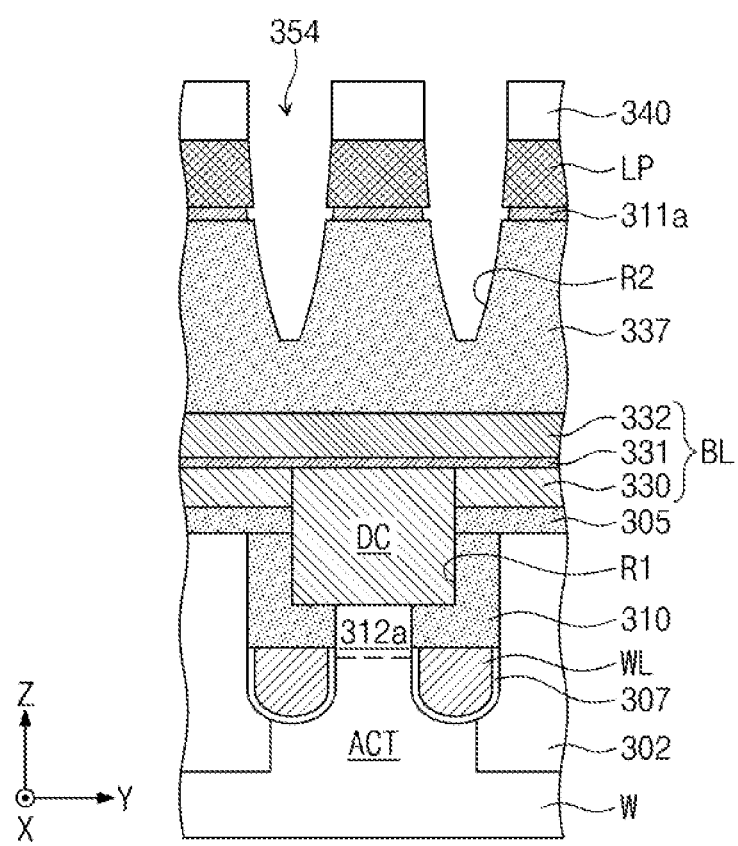

Referring to FIGS. 22A and 22B, the sacrificial spacer 323 may be exposed by an anisotropic etching process of partially removing the bit line capping patterns 337 and the third sub-spacers 327, which are exposed through the openings 354. During the anisotropic etching process, an etchant supply may be controlled to suppress sidewalls of the landing pad LP from being etched, and thus a width of the landing pad LP may be prevented from being further reduced. At this time, a second recess region R2 may be formed on the bit line capping pattern 337. The second mask patterns 340 may be removed.

Figure 23A:
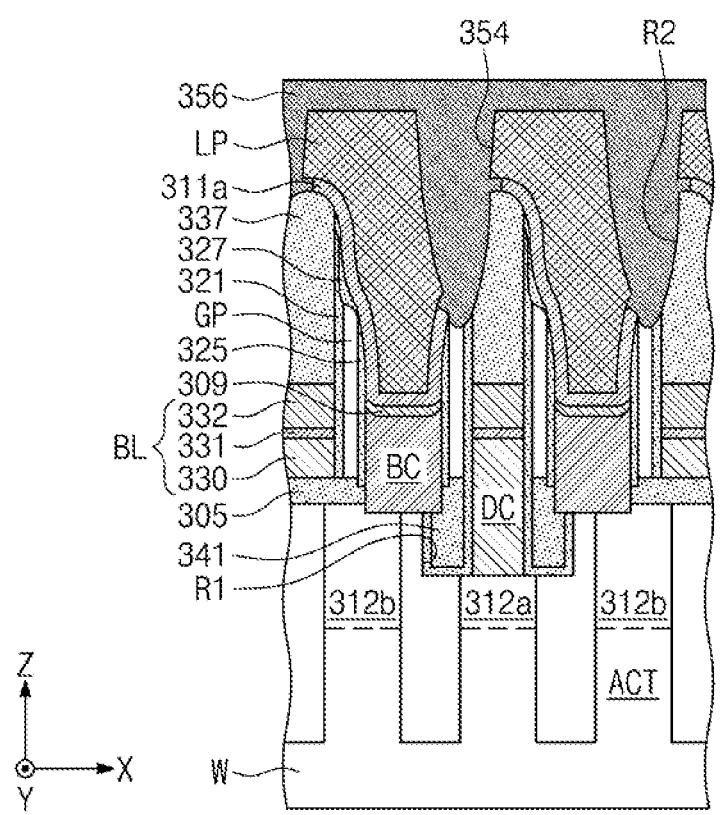
Figure 23B:
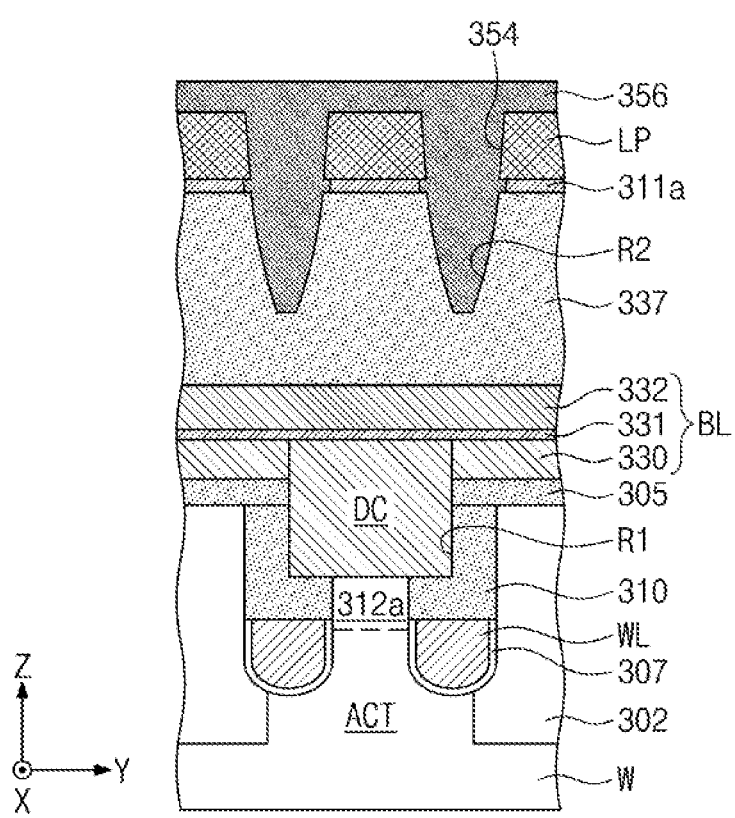

Referring to FIGS. 23A and 23B, an isotropic etching process may be performed to remove the sacrificial spacer 323, thereby forming a gap region GP between the first sub-spacer 321 and the second sub-spacer 325. The sacrificial spacer 323 may thus not remain, but may be completely replaced by a gap region GP (e.g., an air gap region). Thus, capacitance distribution of the bit line BL may be reduced.

Next, a pyrolysis layer 356 may be formed to fill the openings 354 and the second recess regions R2, and may be formed on the landing pads LP. The pyrolysis layer 356 may be formed to close an upper portion of the gap region GP. For example, the pyrolysis layer 356 may be formed of a thermally decomposable polymer or a thermally decomposable organic compound capable of decomposing into gases when heated.

Figure 24A:
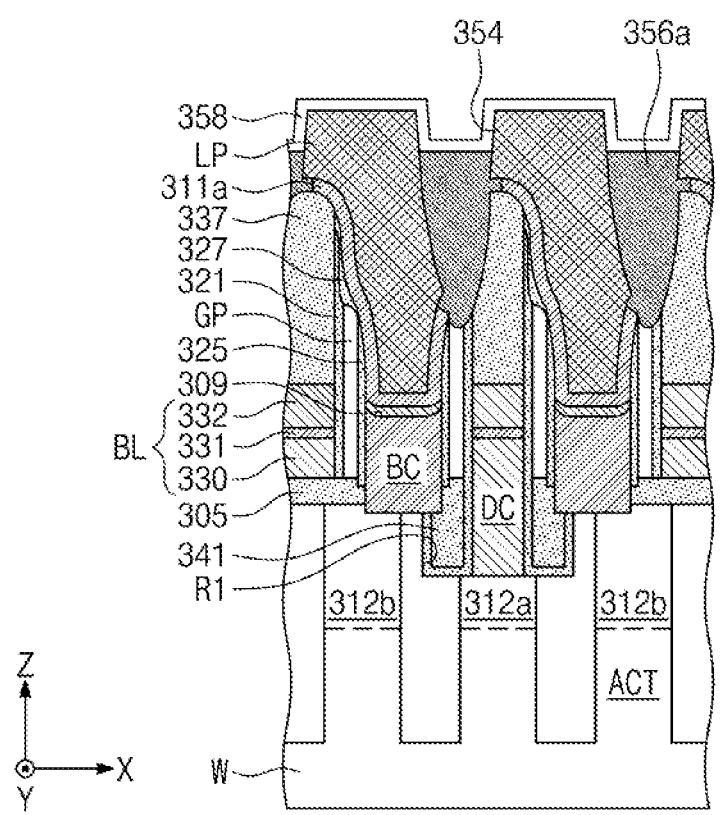
Figure 24B:
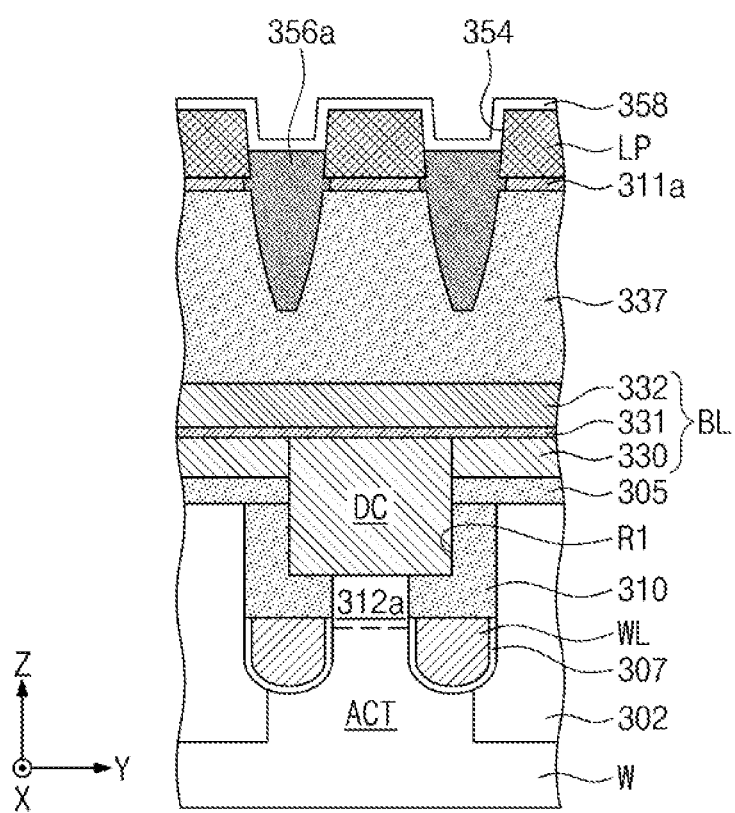

Referring to FIGS. 24A and 24B, a first thermal treatment process may be performed to thermally decompose and remove an upper portion of the pyrolysis layer 356, to expose the top and upper side surfaces of the landing pads LP, and to form pyrolysis patterns 356a spaced apart from each other. A first capping layer 358 may be conformally formed on the pyrolysis patterns 356a and the landing pads LP. For example, the first capping layer 358 may be formed of a material which is permeable to gases generated during the thermal decomposition of the pyrolysis patterns 356a. In an example embodiment of the present inventive concept, the first capping layer 358 may be formed of an organic material or a porous inorganic material.

Figure 25A:
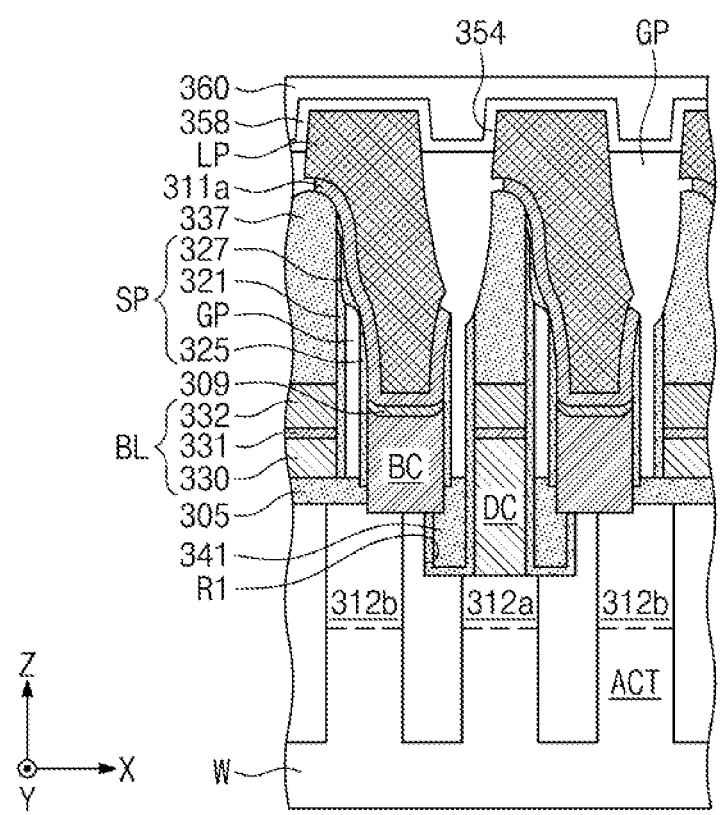
Figure 25B:
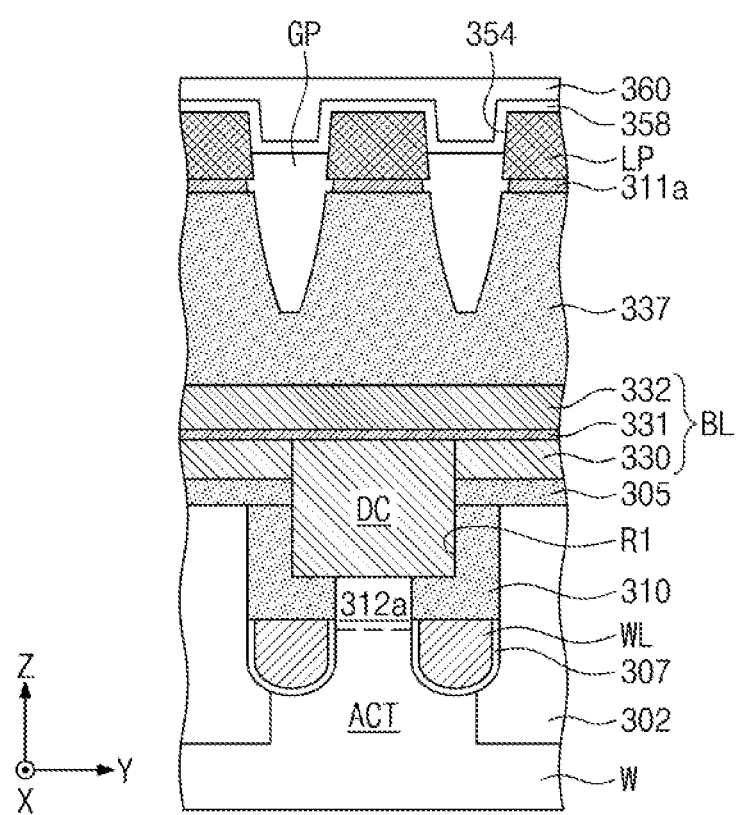

Referring to FIGS. 25A and 25B, a second thermal treatment process may be performed to thermally decompose and remove all of the pyrolysis patterns 356a. The pyrolysis patterns 356a may be removed by an out-gassing process through the first capping layer 358. Accordingly, the gap region GP may be expanded between the landing pads LP, and may be extended into regions between the first sub-spacer 321 and the second sub-spacer 325. According to an example embodiment of the present inventive concept, as the gap region GP is filled with air whose dielectric constant is less than that of silicon oxide ($SiO_2$), a semiconductor device may decrease in parasitic capacitance between the bit line BL and the storage node contact BC. A spacer SP may include the first sub-spacer 321, the gap region GP, the second sub-spacer 325, and third sub-spacer 327. Thereafter, a second capping layer 360 may be formed on the first capping layer 358.

Figure 26A:
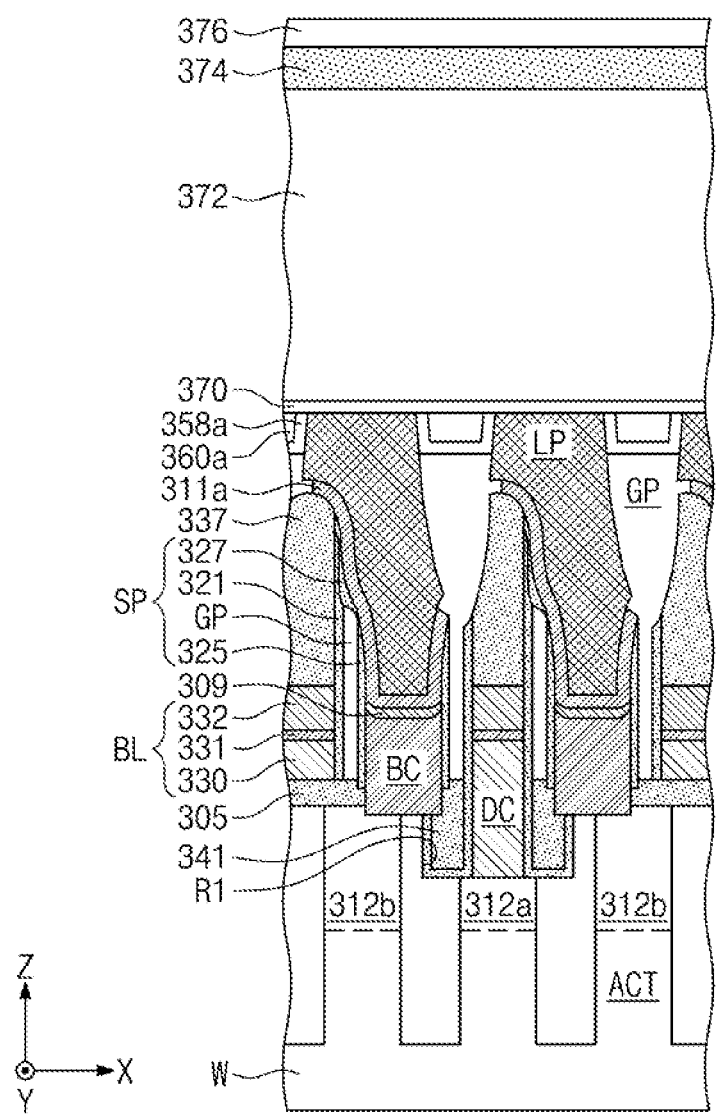
Figure 26B:
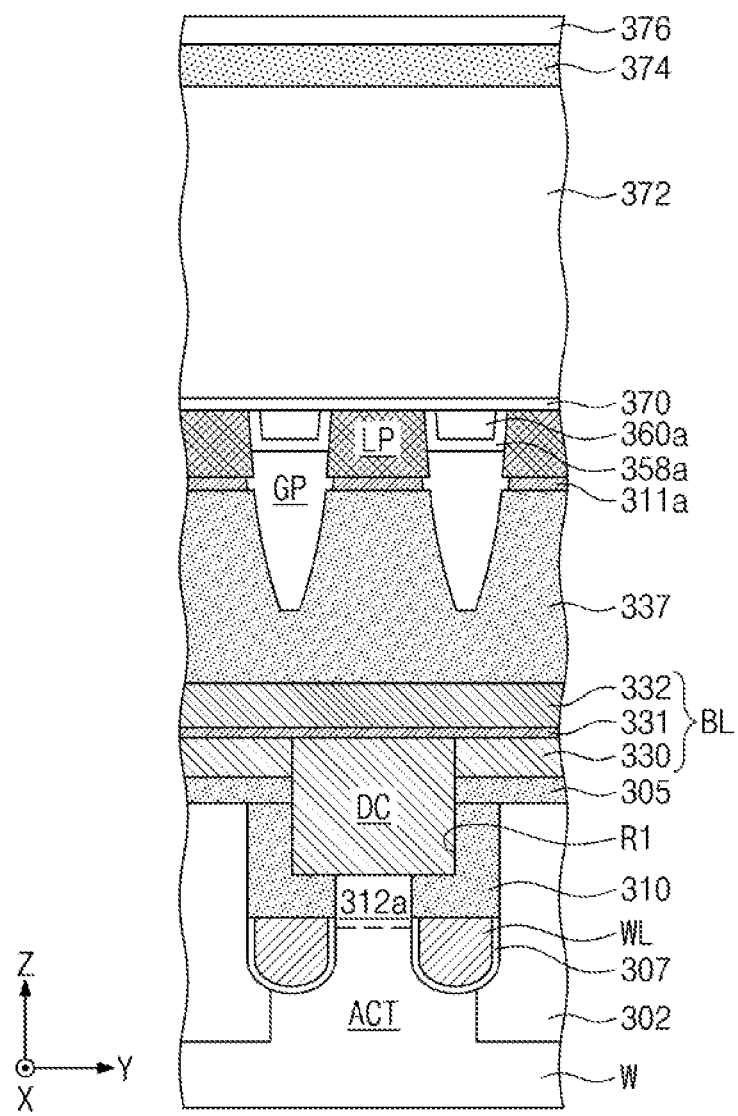

Referring to FIGS. 26A and 26B, an etch-back process or a CMP process may be performed to remove the first capping layer 358 and the second capping layer 360 on the landing pads LP to expose the landing pads LP, and to form the first capping pattern 358a and the second capping pattern 360a. Next, an etch stop layer 370 may be formed on the landing pads LP, the first capping pattern 358a and the second capping pattern 360a. A first mold layer 372, a supporting layer 374, and a second mold layer 376 may be sequentially formed on the etch stop layer 370. The etch stop layer 370 and the supporting layer 374 may be formed of or include, for example, silicon nitride ($Si_3N_4$). The first mold layer 372 and the second mold layer 376 may be formed of or include a material having an etch selectivity with respect to the supporting layer 374. For example, the first mold layer 372 and the second mold layer 376 may be formed of or include, for example, silicon oxide ($SiO_2$).

Figure 27A:
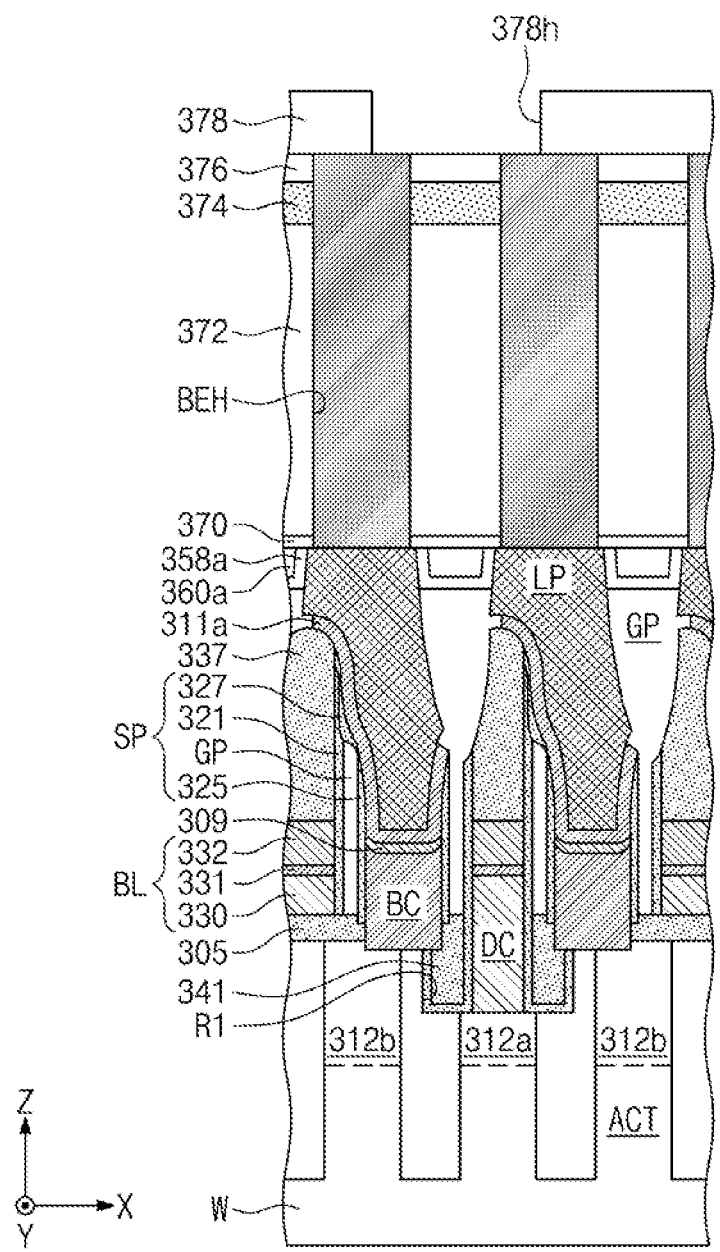
Figure 27B:
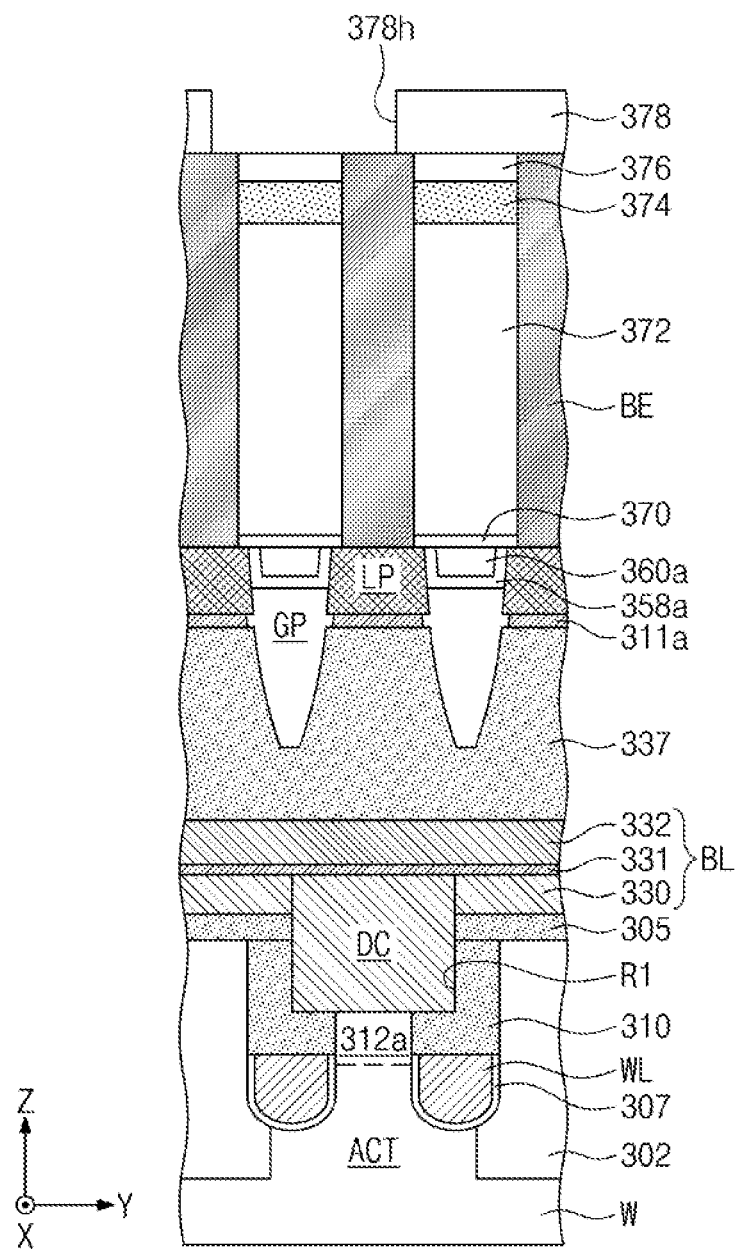

Referring to FIGS. 27A and 27B, the second mold layer 376, the supporting layer 374, the first mold layer 372, and the etch stop layer 370 may be sequentially patterned to form a bottom electrode hole BEH exposing the landing pad LP.

Referring to FIGS. 10, 27A, and 27B, a bottom electrode BE may be formed in the bottom electrode hole BEH (S80). The formation of the bottom electrode BE may include forming a conductive layer to fill the bottom electrode hole BEH and performing an etch-back process or a CMP process on the conductive layer to expose the second mold layer 376. A third mask pattern 378 may be formed on the second mold layer 376. A photolithography process, or a photolithography process and an etching process may be used to form the third mask pattern 378. The third mask pattern 378 may have an opening 378h delimiting a support hole. The opening 378h may be formed to expose portions of top surfaces of adjacent ones of the bottom electrodes BE and the second mold layer 376 therebetween.

Figure 28A:
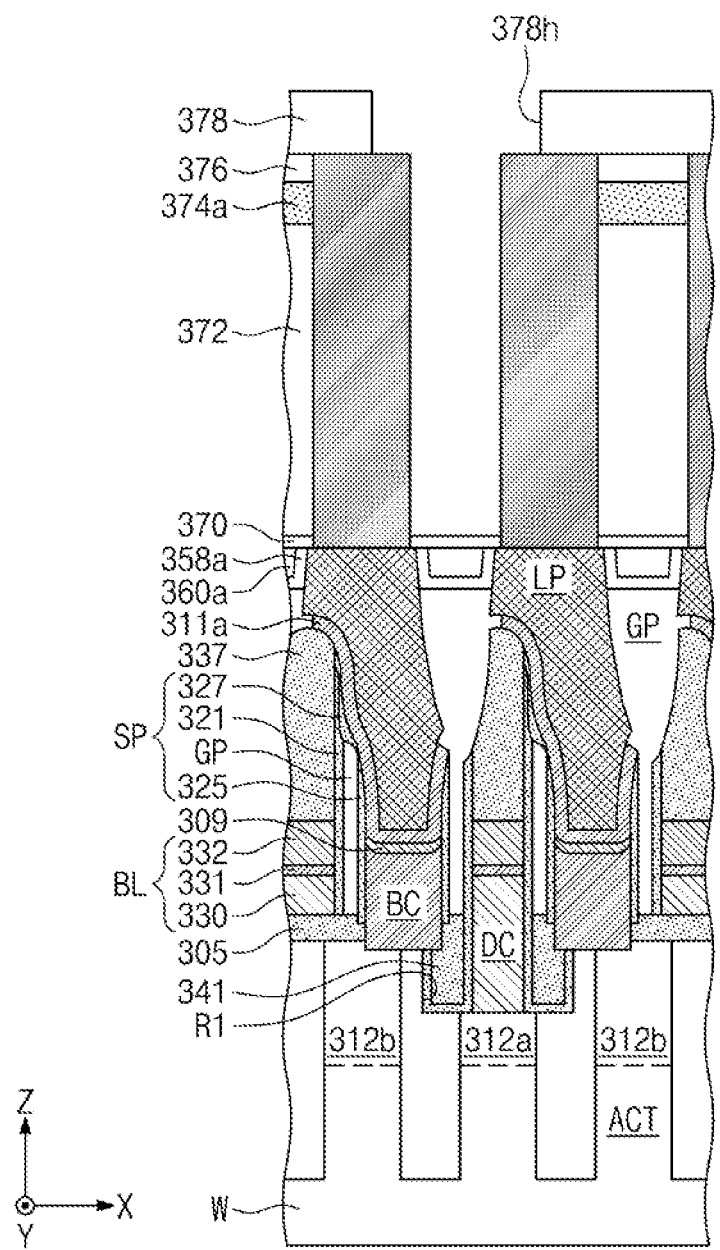
Figure 28B:
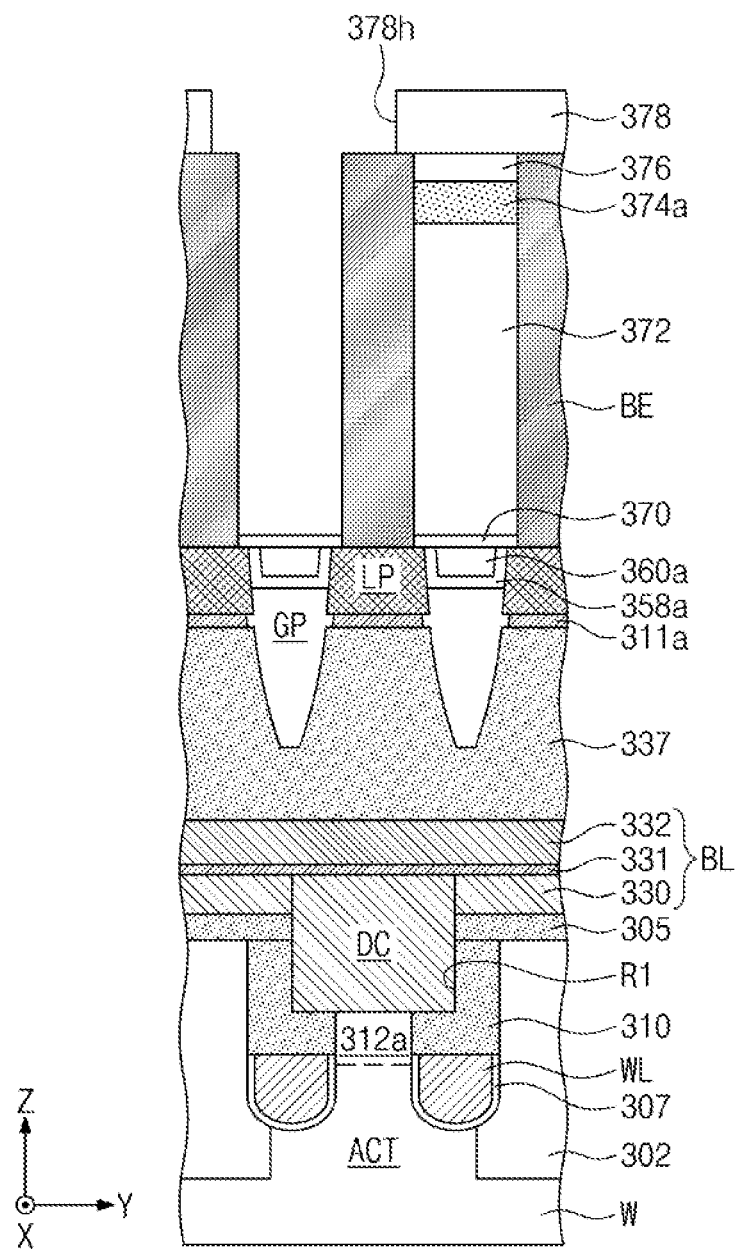

Referring to FIGS. 28A and 28B, an anisotropic etching process may be performed using the third mask pattern 378 as an etch mask to remove the second mold layer 376 exposed by the opening 378h and the supporting layer 374 and the first mold layer 372 thereunder, and as a result, a supporting pattern 374a may be formed to expose the first mold layer 372.

Figure 29A:
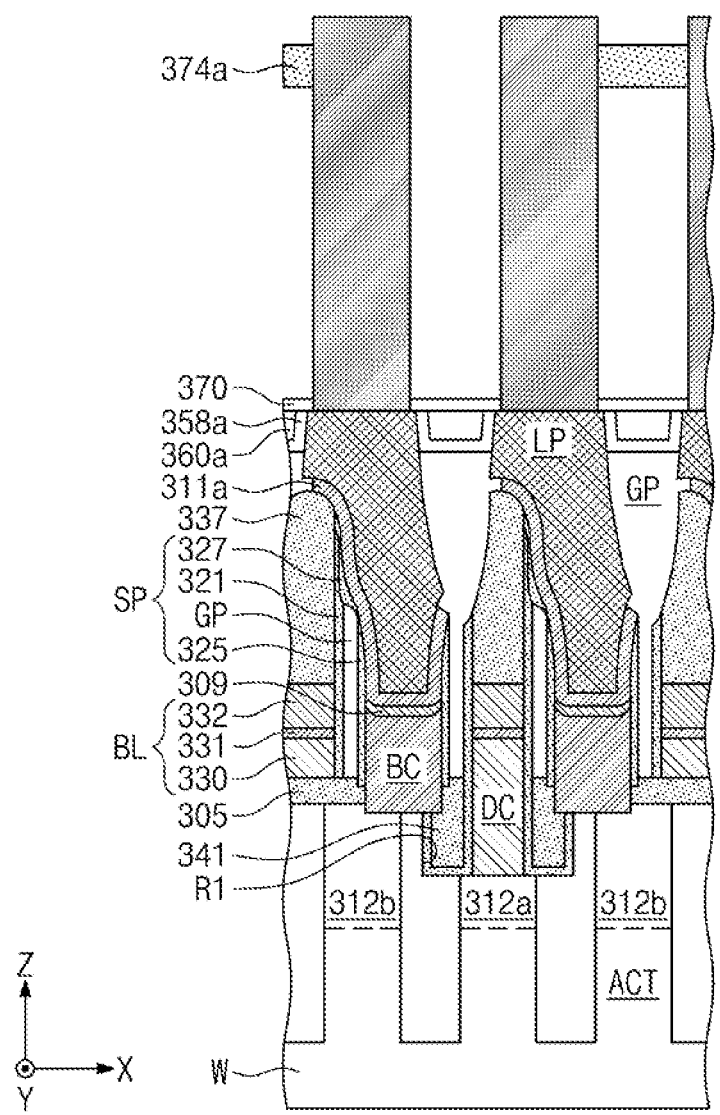
Figure 29B:
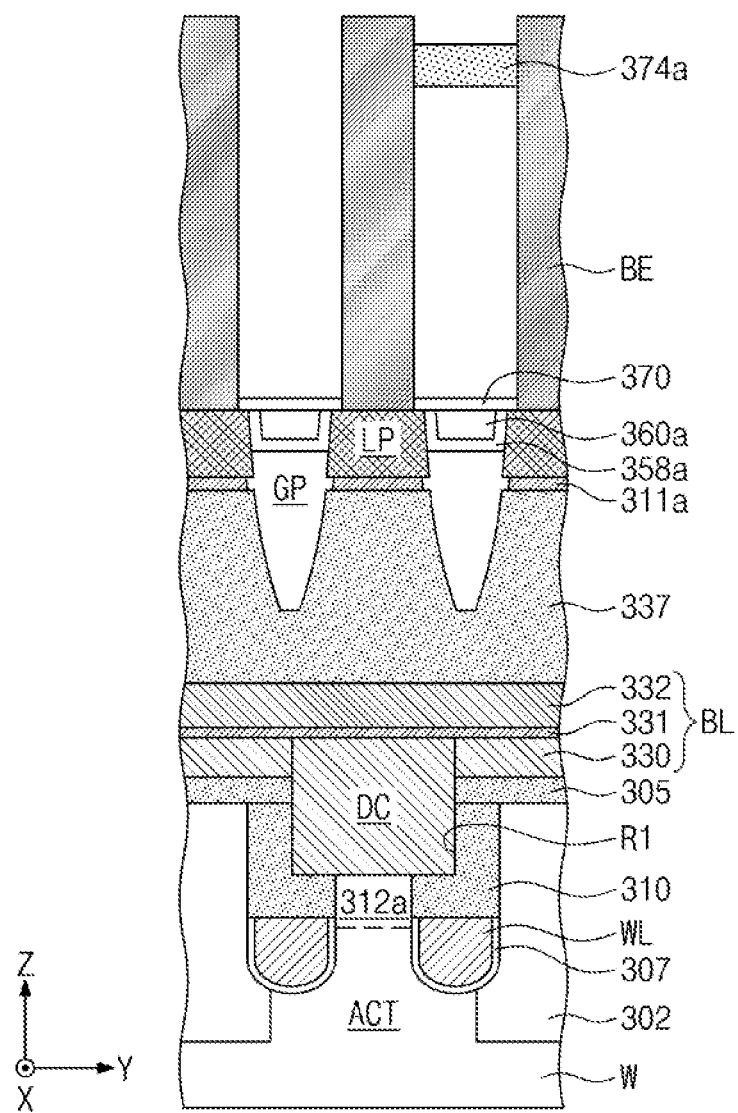

Referring to FIGS. 29A and 29B, the third mask pattern 378 may be removed to expose the second mold layer 376. An isotropic etching process may be performed to remove the first mold layer 372 and the second mold layer 376 and to expose the surfaces of the bottom electrode BE and the supporting pattern 374a. In an example embodiment of the present inventive concept, the isotropic etching process may be a wet etching process.

Figure 30A:
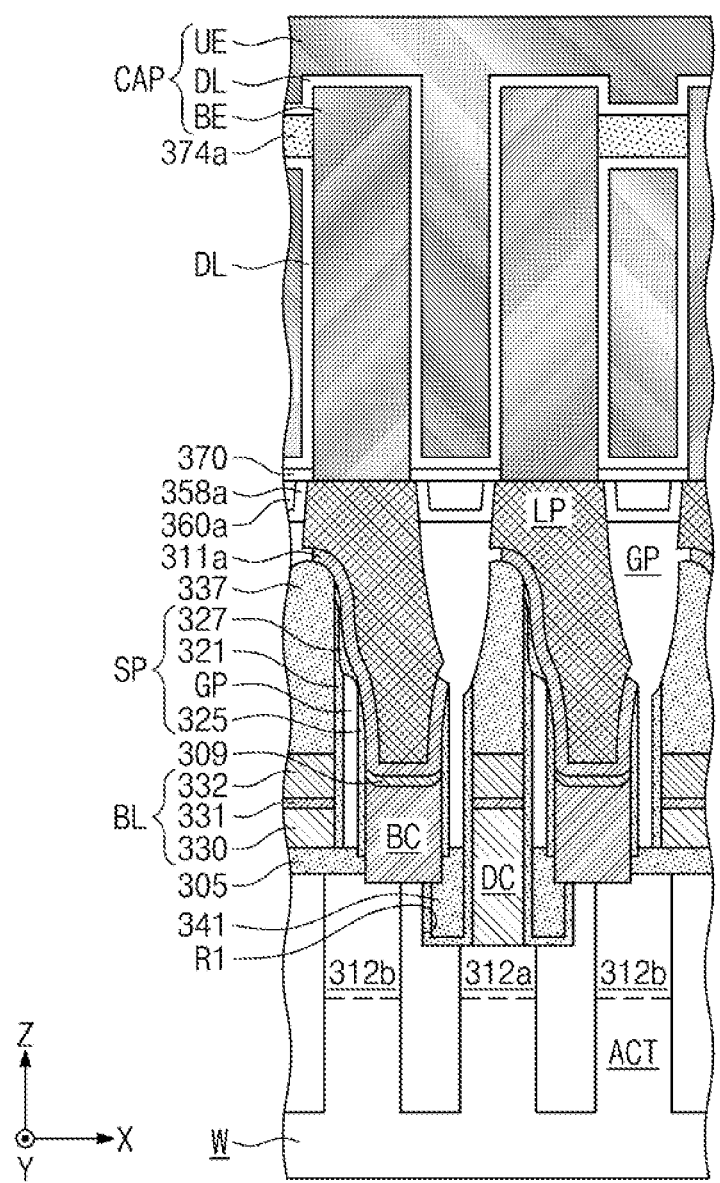
Figure 30B:
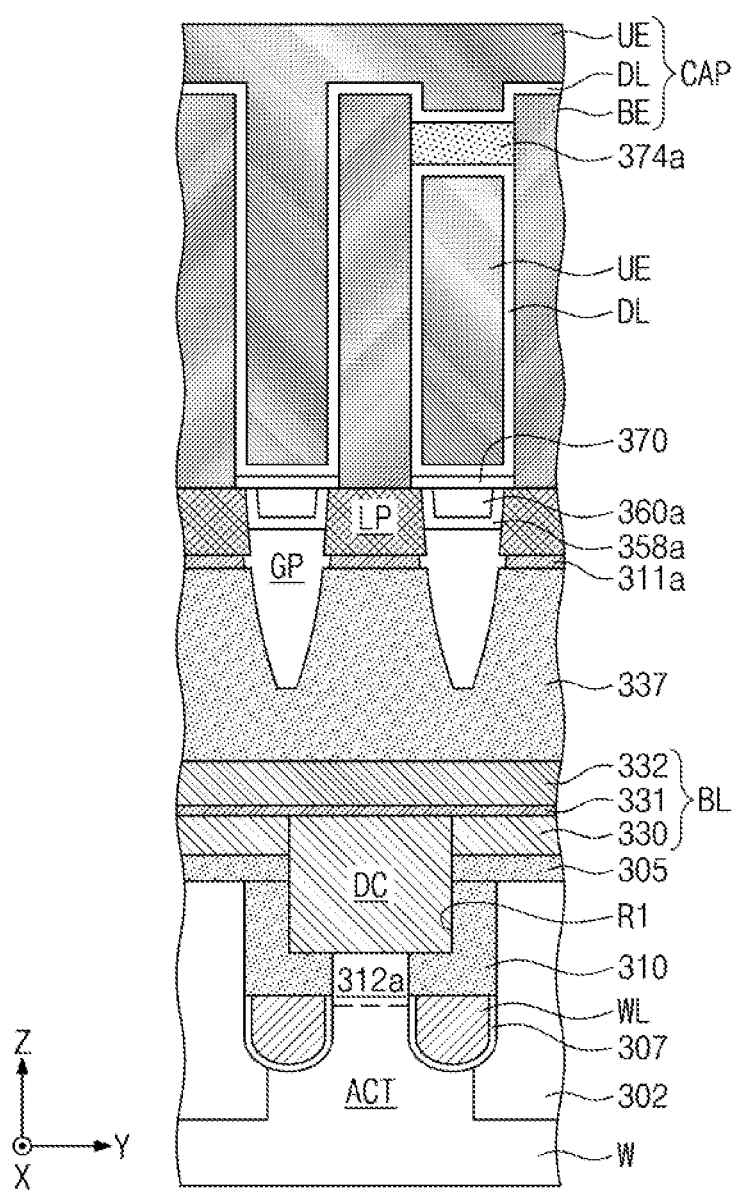

Referring to FIGS. 10, 30A, and 30B, a dielectric layer DL and an upper electrode UE may be sequentially formed on the bottom electrode BE and the supporting pattern 374a (S90). The dielectric layer DL may conformally cover the bottom electrode BE and the supporting pattern 374a. The upper electrode UE may be formed on the dielectric layer DL. The bottom electrode BE, the dielectric layer DL and the upper electrode UE may constitute a capacitor CAP.

Figure 31:
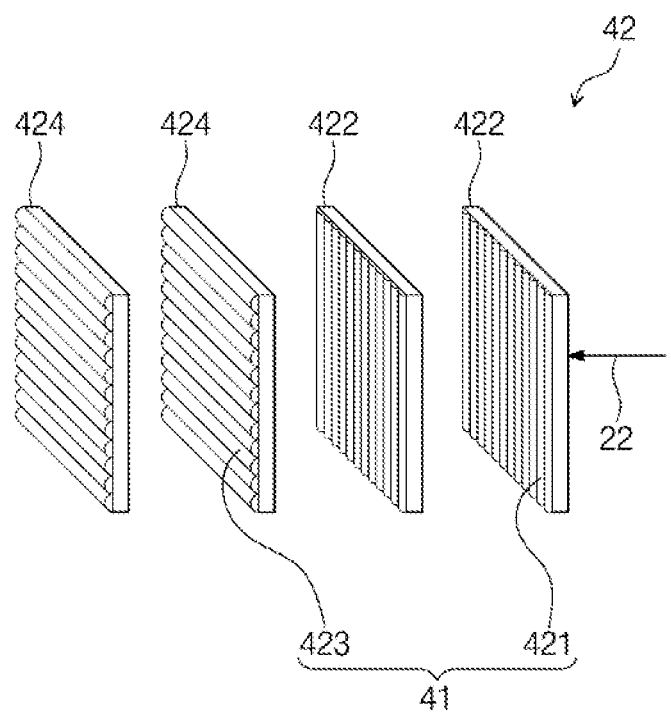
FIG. 31 is a perspective view illustrating an example of an array lenses of FIG. 1.

FIG. 31 illustrates an example of the array lenses 42 of FIG. 1.

Referring to FIG. 31, the first array lenses 422 and the second array lenses 424 of the array lenses 42 may be disposed to be spaced apart from each other. For example, the first array lenses 422, which are spaced apart from each other, may be disposed to be spaced apart from the second array lenses 424, which are spaced apart from each other. For example, a pair of the first array lenses 422 next to each other and a pair of the second array lenses 424 next to each other may be sequentially disposed in a propagation direction of the laser beam 22. However, the present inventive concept is not limited thereto. For example, the number of the first array lenses 422 and/or the number of the second array lenses 424 may be more than two. The first lens cells 421 of the first array lenses 422 and the second lens cells 423 of the second array lenses 424 may be configured to have features the same as those of FIG. 5. For example, the pillar directions of the first lens cells 421 and the pillar directions of the second lens cells 423 may be perpendicular to the direction of the laser beam 22.

According to an example embodiment of the present inventive concept, a laser annealing system may be configured to adjust a diameter of a laser beam to a value that is about 10 to 12 times a width of a lens cell of an array lens, as described above, and thus the percentile distribution and homogeneity of the laser beam may be enhanced.

While example embodiments have been particularly shown and described, it will be understood by one of ordinary skill in the art that variations in form and detail may be made therein without departing from the spirit and scope of the present inventive concept as defined by the appended claims.

What is claimed is:
1. A laser annealing system, comprising:
   a stage receiving a substrate;
   a plurality of laser devices generating a plurality of laser beams and providing the laser beams to the substrate;

a plurality of delivery mirrors disposed between the plurality of laser devices and the stage, the plurality of delivery mirrors used to deliver the laser beams;

a homogenizing system disposed between the plurality of delivery mirrors and the stage, the homogenizing system including an array lens having a plurality of lens cells which allow the laser beams to pass therethrough and homogenize the laser beams; and an imaging optical system disposed between the homogenizing system and the stage to image the laser beams on the substrate, wherein the delivery mirrors comprise:

first delivery mirrors;

second delivery mirrors disposed between the first delivery mirrors and the homogenizing system to be configured to collimate the laser beams in a first direction, and third delivery mirrors disposed between the second delivery mirrors and the homogenizing system, wherein the third delivery mirrors include an upper mirror having second circular reflection surface as second outer mirror, wherein the second delivery mirrors include:

first outer mirror having first circular reflection surfaces; and first and second inner mirrors disposed between the first and second outer mirrors, the first and second inner mirrors having first and second semicircular reflection surfaces, respectively, wherein the first and second outer mirrors and the first and second inner mirrors are arranged in a first direction, wherein the first inner mirror includes a first vertical edge and a first rounded edge opposite to the first vertical edge, wherein the second inner mirror includes a second vertical edge and a second rounded edge opposite to the second vertical edge, wherein the first and second vertical edges disposed adjacent to a center line between centers of the first and second circular reflection surfaces of the first and second outer mirrors, and wherein the first and second vertical edges have a distance greater than a diameter of one of the laser beams in a second direction intersecting the first direction.

2. The laser annealing system of claim 1, further includes beam expanders disposed between the first delivery mirrors and the second delivery mirrors to adjust a diameter of each of the laser beams to a value that is 12 times a width of each of the lens cells or smaller.

3. The laser annealing system of claim 2, wherein the plurality of delivery mirrors collimates the laser beams in such a way that the laser beams are spaced apart from each other by a distance corresponding to the width of each of the lens cells.

4. The laser annealing system of claim 1, wherein a width of each of the lens cells is 2 mm, and a distance between two adjacent ones of the laser beams is 2 mm.

5. The laser annealing system of claim 1, wherein the plurality of delivery mirrors adjusts each of the laser beams to have a diameter ranging from 20 mm to 24 mm.

6. The laser annealing system of claim 1, wherein the plurality of delivery mirrors further comprise:

fourth delivery mirror disposed between the third delivery mirrors and the homogenizing system.

7. The laser annealing system of claim 6, wherein the third delivery mirrors comprise:

the upper mirror having the second circular reflection surface; and an other mirror disposed between the upper mirror and the fourth mirror.

8. The laser annealing system of claim 1, wherein the laser devices comprise:

first and second lower laser devices;

first and second upper laser devices disposed on the first and second lower laser devices; and first to third intermediate laser devices disposed between the first and second lower laser devices and the first and second upper laser devices.

9. The laser annealing system of claim 8, wherein the laser devices further comprise:

a third lower laser device disposed between the first and second lower laser devices; and a third upper laser device disposed between the first and second upper laser devices.

10. A laser annealing system, comprising:

a stage receiving a substrate;

a plurality of laser devices generating a plurality of laser beams and providing the laser beams onto the substrate, the plurality of laser devices comprising first and second lower laser devices linearly arranged in a first direction, first to third intermediate laser devices disposed on the first and second lower laser devices and linearly arranged in the first direction, and first and second upper laser devices disposed on the first to third intermediate laser devices and linearly arranged in the first direction with the plurality of laser devices including seven to nine laser devices together two-dimensionally arranged to constitute a planar light source and with each of the laser beams output from each of the seven to nine laser devices;

a homogenizing system disposed between the light source and the stage, the homogenizing system including array lenses having a plurality of lens cells which allow the laser beams to pass therethrough and homogenize the laser beams;

a plurality of delivery mirrors disposed between the homogenizing system and the light source to deliver the laser beams and beam expanders disposed between the delivery mirrors to adjust a diameter of each of the laser beams to a value that is 10 to 12 times a width of each of the lens cells of the array lenses wherein the laser beams are spaced apart from each other; and an imaging optical system disposed between the homogenizing system and the stage to image the laser beams on the substrate, wherein the delivery mirrors comprise:

first delivery mirrors;

second delivery mirrors disposed between the first delivery mirrors and the homogenizing system to be configured to collimate the laser beams in a first direction, and third delivery mirrors disposed between the second delivery mirrors and the homogenizing system, wherein the third delivery mirrors include an upper mirror having second circular reflection surface as second outer mirror, wherein the second delivery mirrors include:

first outer mirror having first circular reflection surfaces; and first and second inner mirrors disposed between the first and second outer mirrors, the first and second inner mirrors having first and second semicircular reflection surfaces, respectively, wherein the first and second outer mirrors and the first and second inner mirrors are arranged in a first direction, wherein the first inner mirror includes a first vertical edge and a first rounded edge opposite to the first vertical edge, wherein the second inner mirror includes a second vertical edge and a second rounded edge opposite to the second vertical edge, wherein the first and second vertical edges disposed adjacent to a center line between centers of the first and second circular reflection surfaces of the first and second outer mirrors, and wherein the first and second vertical edges have a distance greater than a diameter of one of the laser beams in a second direction intersecting the first direction.

11. The laser annealing system of claim 10, wherein each of the lens cells has a square shape.

12. The laser annealing system of claim 10, wherein the lens cells comprise:
first lens cells; and
second lens cells having a shape different from that of the first lens cells.

13. The laser annealing system of claim 12, wherein the array lenses comprise:
first array lenses having the first lens cells; and
second array lenses having the second lens cells,
wherein the first array lenses and the second array lenses are alternately arranged.

14. The laser annealing system of claim 13, wherein the first lens cells have a vertical pillar shape, and
the second lens cells have a horizontal pillar shape.

* * * * *